(12) United States Patent
Matsumoto

(10) Patent No.: US 10,020,165 B2
(45) Date of Patent: *Jul. 10, 2018

(54) MULTI CHARGED PARTICLE BEAM WRITING METHOD, AND MULTI CHARGED PARTICLE BEAM WRITING APPARATUS

(71) Applicant: NuFlare Technology, Inc., Yokohama-shi (JP)

(72) Inventor: Hiroshi Matsumoto, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/278,963

(22) Filed: Sep. 28, 2016

(65) Prior Publication Data
US 2017/0103869 A1  Apr. 13, 2017

(30) Foreign Application Priority Data

Oct. 7, 2015  (JP) .................................. 2015-199388

(51) Int. Cl.
*H01J 37/04* (2006.01)
*H01J 37/317* (2006.01)
*H01J 37/304* (2006.01)

(52) U.S. Cl.
CPC ........ *H01J 37/304* (2013.01); *H01J 37/3177* (2013.01); *H01J 2237/24514* (2013.01);
(Continued)

(58) Field of Classification Search
CPC .. H01J 37/3174; H01J 37/3007; H01J 37/045; H01J 37/304; B82Y 10/00;
(Continued)

(56) References Cited

U.S. PATENT DOCUMENTS

| 9,299,533 B2 * | 3/2016 | Matsumoto ......... H01J 37/3007 |
| 2013/0252145 A1 | 9/2013 | Matsumoto |
| 2014/0367584 A1 | 12/2014 | Matsumoto |

FOREIGN PATENT DOCUMENTS

| JP | 2013-197469 | 9/2013 |
| JP | 2015-2189 | 1/2015 |

(Continued)

OTHER PUBLICATIONS

Korean Office Action dated Sep. 11, 2017 in Korean Patent Application No. 10-2016-0129169 (with English translation).

*Primary Examiner* — Nicole Ippolito
(74) *Attorney, Agent, or Firm* — Oblon, McClelland, Maier & Neustadt, L.L.P.

(57) ABSTRACT

A multi charged particle beam writing method includes calculating an offset dose to irradiate all the small regions by multiplying one beam dose equivalent to a maximum irradiation time of multi-beams of each pass in multiple writing by a maximum number of defective beams being always ON to irradiate one of the small regions; calculating an incident dose, in addition to the offset dose, for each of the small regions; and performing multiple writing, using multi-beams including a defective beam being always ON, such that a beam of a total dose, between the incident dose and the offset dose, irradiates a corresponding small region for each small region, while switching a beam for each pass of the multiple writing, and controlling an irradiation time equivalent to the offset dose by a common blanking mechanism collectively blanking-controlling the multi-beams.

11 Claims, 22 Drawing Sheets

(52) U.S. Cl.
CPC ............... *H01J 2237/31766* (2013.01); *H01J 2237/31769* (2013.01); *H01J 2237/31774* (2013.01)

(58) Field of Classification Search
CPC ........... B82Y 40/00; G01N 23/18; G03F 1/24; G03F 1/78
USPC ......... 250/396 R, 397, 492.1, 492.2, 492.21, 250/492.22, 492.23, 492.3
See application file for complete search history.

(56) References Cited

FOREIGN PATENT DOCUMENTS

| | | |
|---|---|---|
| JP | 2015-165565 A | 9/2015 |
| KR | 10-2014-0065353 A | 5/2014 |

* cited by examiner

| Divided Shot Order | k | k-1 | k-2 | k-3 | ... |
|---|---|---|---|---|---|
| Beam 1 | 1 | 1 | 0 | 1 | ... |
| Beam 2 | 1 | 1 | 0 | 0 | ... |
| Beam 3 | 0 | 1 | 1 | 0 | ... |
| Beam 4 | 0 | 1 | 1 | 1 | ... |
| Beam 5 | 1 | 0 | 1 | 1 | ... |
| ⋮ | | | | | |

FIG.14

| tk | Beam |
|---|---|
| 512Δ | b |
| 256Δ | a |
| 128Δ | b |
| 64Δ | a |
| 32Δ | a |
| 16Δ | a |
| 8Δ | a |
| 4Δ | a |
| 2Δ | a |
| Δ | a |

Sorting ⇒

| tk | Beam | Irradiation Time of Each Beam |
|---|---|---|
| 512Δ | b | 640Δ |
| 128Δ | b | |
| 256Δ | a | 383Δ |
| 64Δ | a | |
| 32Δ | a | |
| 16Δ | a | |
| 8Δ | a | |
| 4Δ | a | |
| 2Δ | a | |
| Δ | a | |

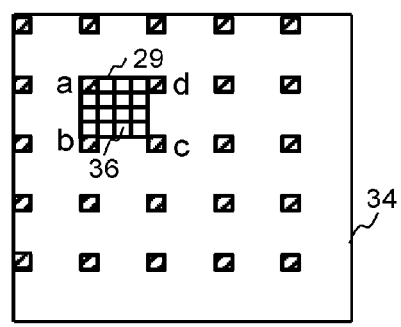
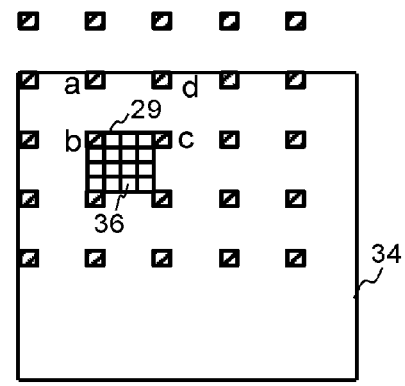
FIG.21A  FIG.21B
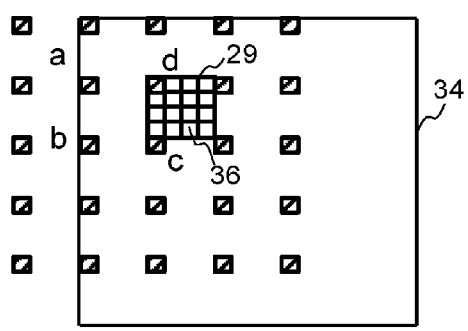
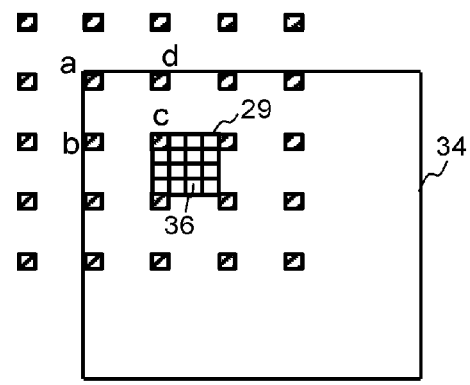
FIG.21D  FIG.21C

MULTI CHARGED PARTICLE BEAM WRITING METHOD, AND MULTI CHARGED PARTICLE BEAM WRITING APPARATUS

CROSS-REFERENCE TO RELATED APPLICATION

This application is based upon and claims the benefit of priority from the prior Japanese Patent Application No. 2015-199388 filed on Oct. 7, 2015 in Japan, the entire contents of which are incorporated herein by reference.

BACKGROUND OF THE INVENTION

Field of the Invention

Embodiments of the present invention relate generally to a multi charged particle beam writing method and a multi charged particle beam writing apparatus, and more specifically, relate, for example, to a beam irradiation method of multi-beam writing.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits becomes progressively narrower year by year. The electron beam writing technique, which intrinsically has excellent resolution, is used for writing or "drawing" patterns on a wafer and the like with electron beams.

As a known example of employing the electron beam writing technique, there is a writing apparatus using multi-beams. Since it is possible for multi-beam writing to irradiate multiple beams at a time, the writing throughput can be greatly increased in comparison with single beam writing. A writing apparatus employing the multi-beam technique, for example, forms multi-beams by letting portions of an electron beam emitted from an electron gun pass through a corresponding hole of a plurality of holes in a mask, performs blanking control for each beam, reduces each unblocked beam by an optical system, and deflects it by a deflector so as to irradiate a desired position on a target object or "sample".

In multi-beam writing, the dose of each beam is individually controlled based on the irradiation time. Therefore, individual blanking mechanisms which can individually control ON/OFF of each beam are arranged in an array. If the number of beams increases, uncontrollable defective beams may be generated. For example, a continuous OFF beam which is unable to be emitted, and a continuous ON beam which is uncontrollable to be OFF are generated. If a defective beam is a continuous OFF beam, another beam can be a substitute to irradiate the target object surface. However, it is difficult to take measures for a continuous ON beam.

In order to solve this problem, there is proposed a method utilizing multiple exposure. For example, in M time exposures, one exposure is performed with a continuous ON beam (defective beam), and the remaining M-1 time exposures are performed with proper (normal) beams. However, since the continuous ON beam performs irradiation even during standby time for switching the beam to another pixel, the error of the irradiation time increases. In electron beam exposure, it is requested to perform dose control at the precision of about 0.1%. However, since exposure of multiple exposure is generally performed about eight times or sixteen times at most, even if the error of the irradiation time is equalized by the number of times, it is difficult to reduce the dose error to an allowable range.

As other countermeasures to the continuous ON beam, there is proposed a method of arranging blanking devices in two stages, in each of which a plurality of individual blanking mechanisms are arrayed, in order to block a continuous ON beam generated due to failure of one of the individual blanking mechanisms, by the other individual blanking mechanism (for example, refer to Japanese Unexamined Patent Application Publication (JP-A) No. 2013-197469). According to this method, it is necessary for the blanking device to include a large number of individual blanking mechanisms, each of which needs to have a control circuit. Therefore, the structure of the two-stage blanking device makes itself complicated and large.

Further regarding the multi-beam writing, there is proposed a method of dividing a shot of required irradiation time to irradiate the same position into a plurality of times of irradiation steps, and irradiating a target object continuously with the same beam in each irradiation step (for example, refer to Japanese Unexamined Patent Application Publication (JP-A) No. 2015-002189).

BRIEF SUMMARY OF THE INVENTION

According to one aspect of the present invention, a multi charged particle beam writing method includes: calculating an offset dose to irradiate all of a plurality of small regions by multiplying one beam dose equivalent to a maximum irradiation time of multi-beams of each pass in multiple writing by a maximum number of defective beams being always ON to irradiate one of the plurality of small regions, which are obtained by dividing a writing region of a target object by a unit irradiation region size of a beam of the multi-beams; calculating an incident dose to irradiate a corresponding small region of the plurality of small regions, in addition to the offset dose, for each small region of the plurality of small regions; and performing multiple writing, using multi-beams including a defective beam being always ON, such that a beam of a total dose, between the incident dose having been calculated for the corresponding small region and the offset dose for the each small region, irradiates the corresponding small region for the each small region, while switching a beam to irradiate the each small region for the each pass of the multiple writing, and controlling an irradiation time equivalent to the offset dose by a common blanking mechanism which collectively blanking-controls the multi-beams.

According to another aspect of the present invention, a multi charged particle beam writing apparatus includes: an offset dose calculation processing circuitry configured to calculate, for each pass of multiple writing, when switching a beam to irradiate each small region of a plurality of small regions obtained by dividing a writing region of a target object by a size of a unit irradiation region for one beam of multi-beams, an offset dose to irradiate all of the plurality of small regions by multiplying a dose equivalent to a maximum in each exposure time of a plurality of pre-set beams used for switching at a pass to irradiate the each small region by a maximum number of defective beams to expose one of the plurality of small regions, by using multi-beams including a defective beam being always ON; a dose calculation processing circuitry configured to calculate an incident dose to irradiate a corresponding small region, in addition to the offset dose, for each small region of the plurality of small regions; and a writing mechanism, including a stage on which the target object is placed and a common blanking mechanism which collectively blanking-controls the multi-beams, configured to perform multiple writing, using multi-beams including a defective beam being always ON, such that a beam of a total dose, between an incident dose having been calculated for the corresponding small region and the offset dose for the each small region, irradiates the corresponding small region for the each small region, while switching a beam to irradiate the each small region for the each pass of the multiple writing, and controlling an irradiation time equivalent to the offset dose by the common blanking mechanism.

BRIEF DESCRIPTION OF THE DRAWINGS

FIG. 14 shows an example of a part of irradiation time array data according to the first embodiment;

FIGS. 21A to 21D illustrate another example of beam switching performed in the middle of applying a plurality of divided shots according to the second embodiment.

DETAILED DESCRIPTION OF THE INVENTION

Embodiments of the present invention describe a multi-beam writing method and apparatus that can control the irradiation time highly accurately even if a continuous ON beam (defective beam) is generated in multi-beams.

In the embodiments below, there is described a configuration in which an electron beam is used as an example of a charged particle beam. The charged particle beam is not limited to the electron beam, and other charged particle beam such as an ion beam may also be used.

First Embodiment

Figure 1:
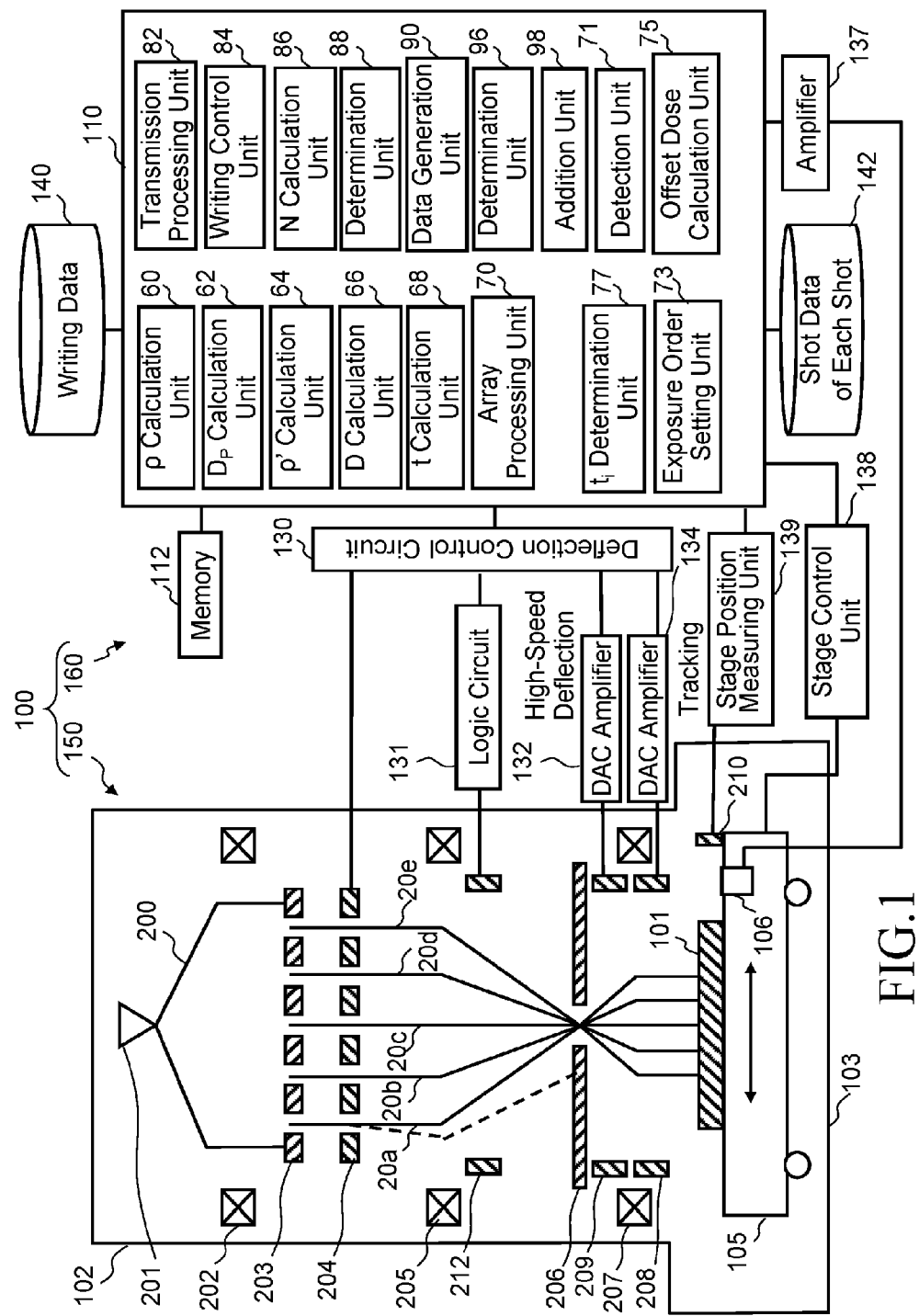
FIG. 1 is a schematic diagram showing a configuration of a writing apparatus according to a first embodiment.

FIG. 1 is a schematic diagram showing a configuration of a writing or "drawing" apparatus according to the first embodiment. As shown in FIG. 1, a writing apparatus 100 includes a writing mechanism 150 and a control unit 160. The writing apparatus 100 is an example of a multi charged particle beam writing apparatus. The writing mechanism 150 includes an electron optical column 102 and a writing chamber 103. In the electron optical column 102, there are arranged an electron gun 201, an illumination lens 202, a forming aperture array substrate 203, a blanking aperture array mechanism 204, a reducing lens 205, a deflector 212, a limiting aperture substrate 206, an objective lens 207, and deflectors 208 and 209. In the writing chamber 103, an XY stage 105 is arranged. On the XY stage 105, a target object or "sample" 101 such as a mask serving as a writing target substrate is placed when writing is performed. The target object 101 is, for example, an exposure mask used for manufacturing semiconductor devices, or is a semiconductor substrate (silicon wafer) for manufacturing semiconductor devices. Moreover, the target object 101 may be, for example, a mask blank on which resist has been applied and nothing has yet been written. A mirror 210 for measuring the position of the XY stage 105 and a Faraday cup 106 for measuring a current are arranged on the XY stage 105.

The control unit 160 includes a control computer 110, a memory 112, a deflection control circuit 130, a logic circuit 131, DAC (digital-analog converter) amplifier units 132 and 134, an amplifier 137, a stage control unit 138, a stage position measuring unit 139, and storage devices 140 and 142 such as magnetic disk drives. The control computer 110, the memory 112, the deflection control circuit 130, the amplifier 137, the stage control unit 138, the stage position measuring unit 139, and the storage devices 140 and 142 are connected with each other through a bus (not shown). Writing data is input from the outside of the writing apparatus 100 into the storage device 140 (storage unit) and stored therein. The deflection control circuit 130 is connected to the logic circuit 130, the DAC amplifier circuits 130 and 132, and the blanking aperture array mechanism 204 through a bus. The logic circuit 131 is connected to the deflector 212. The stage position measuring unit 139 irradiates the mirror 210 on the XY stage 105 with a laser beam, and receives a catoptric light from the mirror 210. Then, the stage position measuring unit 139 measures the position of the XY stage 105 by using information of the catoptric light.

The Faraday cup 106 is connected to the amplifier 137. A current amount signal, being an analog signal, detected by the Faraday cup 106 is converted into a digital signal and amplified by the amplifier 137 so as to be output to the control computer 110.

In the control computer 110, there are arranged a pattern area density $\rho$ calculation unit 60, a proximity effect correction irradiation coefficient $D_p$ calculation unit 62, a pattern area density $\rho'$ in pixel calculation unit 64, a dose D calculation unit 66, an irradiation time t calculation unit 68, an array processing unit 70, a detection unit 71, an exposure order setting unit 73, an offset dose calculation unit 75, an irradiation time $t_i$ determination unit 77, a gray-scale value N calculation unit 86, a determination unit 88, a data generation unit 90, a determination unit 96, an addition unit 98, a transmission processing unit 82, and a writing control unit 84. An incident dose calculation unit 61 is configured by the pattern area density $\rho$ calculation unit 60, the proximity effect correction irradiation coefficient $D_p$ calculation unit 62, the pattern area density $\rho'$ in pixel calculation unit 64, and the dose D calculation unit 66. Each of ". . . units" such as the pattern area density $\rho$ calculation unit 60, the proximity effect correction irradiation coefficient $D_p$ calculation unit 62, the pattern area density $\rho'$ in pixel calculation unit 64, the dose D calculation unit 66, the irradiation time t calculation unit 68, the array processing unit 70, the detection unit 71, the exposure order setting unit 73, the offset dose calculation unit 75, the irradiation time $t_i$ determination unit 77, the gray-scale value N calculation unit 86, the determination unit 88, the data generation unit 90, the determination unit 96, the addition unit 98, the transmission processing unit 82, and the writing control unit 84 includes a processing circuitry. As the processing circuitry, for example, an electric circuit, computer, processor, circuit board, quantum circuit, semiconductor device, or the like can be used. Each ". . . unit" may use a common processing circuitry (same processing circuitry), or different processing circuitries (separate processing circuitries). Data which is input and output to/from the pattern area density $\rho$ calculation unit 60, the proximity effect correction irradiation coefficient $D_p$ calculation unit 62, the pattern area density $\rho'$ in pixel calculation unit 64, the dose D calculation unit 66, the irradiation time t calculation unit 68, the array processing unit 70, the detection unit 71, the exposure order setting unit 73, the offset dose calculation unit 75, the irradiation time $t_i$ determination unit 77, the gray-scale value N calculation unit 86, the determination unit 88, the data generation unit 90, the determination unit 96, the addition unit 98, the transmission processing unit 82, and the writing control unit 84, and data being operated are stored in the memory 112 each time.

FIG. 1 shows configuration elements necessary for describing the first embodiment. It should be understood that other configuration elements generally necessary for the writing apparatus 100 may also be included therein.

Figure 2:
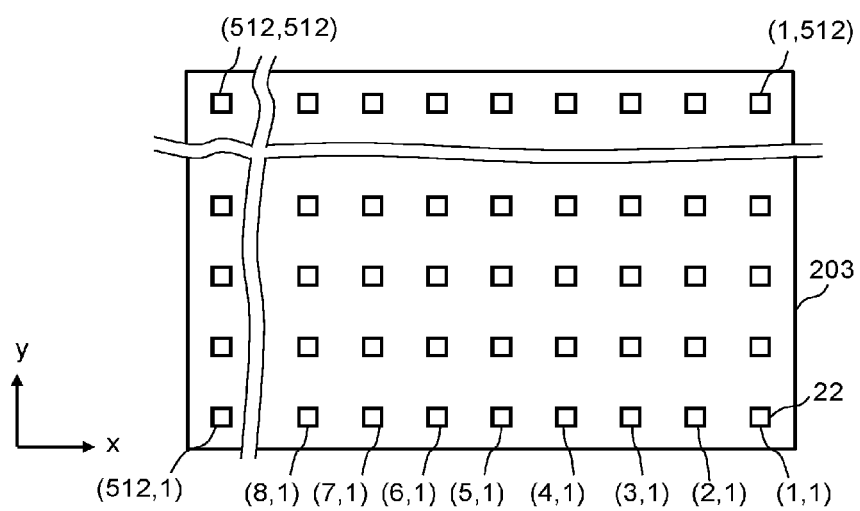
FIG. 2 is a conceptual diagram showing a configuration of a forming aperture array member according to the first embodiment.

FIG. 2 is a conceptual diagram showing a configuration of a forming aperture array member according to the first embodiment. As shown in FIG. 2, holes (openings) 22 of m rows long (y direction) and n columns wide (x direction) ($m \geq 2$, $n \geq 2$) are formed, like a matrix, at a predetermined arrangement pitch in the forming aperture array substrate 203. In FIG. 2, for example, holes 22 of 512 (rows in y direction)×512 (columns in x direction) are formed. Each of the holes 22 is a quadrangle of the same dimensional shape. Alternatively, each of the holes 22 can be a circle of the same circumference. Multi-beams 20 are formed by letting portions of an electron beam 200 individually pass through a corresponding hole of a plurality of holes 22. Here, the case in which the holes 22 of two or more rows and columns are arranged in both the x and y directions is shown, but the arrangement is not limited thereto. For example, it is also acceptable that a plurality of holes 22 are arranged in only one row (x direction) or in only one column (y direction). That is, in the case of only one row, a plurality of holes 22 are arranged as a plurality of columns, and in the case of only one column, a plurality of holes 22 are arranged as a plurality of rows. The method of arranging the holes 22 is not limited to the case of FIG. 2 where holes are arranged like a grid in the length and width directions. For example, with respect to the k-th and the (k+1)th rows arrayed in the length direction (y direction), each hole in the k-th row and each hole in the (k+1)th row may be mutually displaced in the width direction (x direction) by a dimension "a". Similarly, with respect to the (k+1)th and the (k+2)th rows arrayed in the length direction (y direction), each hole in the (k+1)th row and each hole in the (k+2)th row may be mutually displaced in the width direction (x direction) by a dimension "b", for example.

Figure 3:
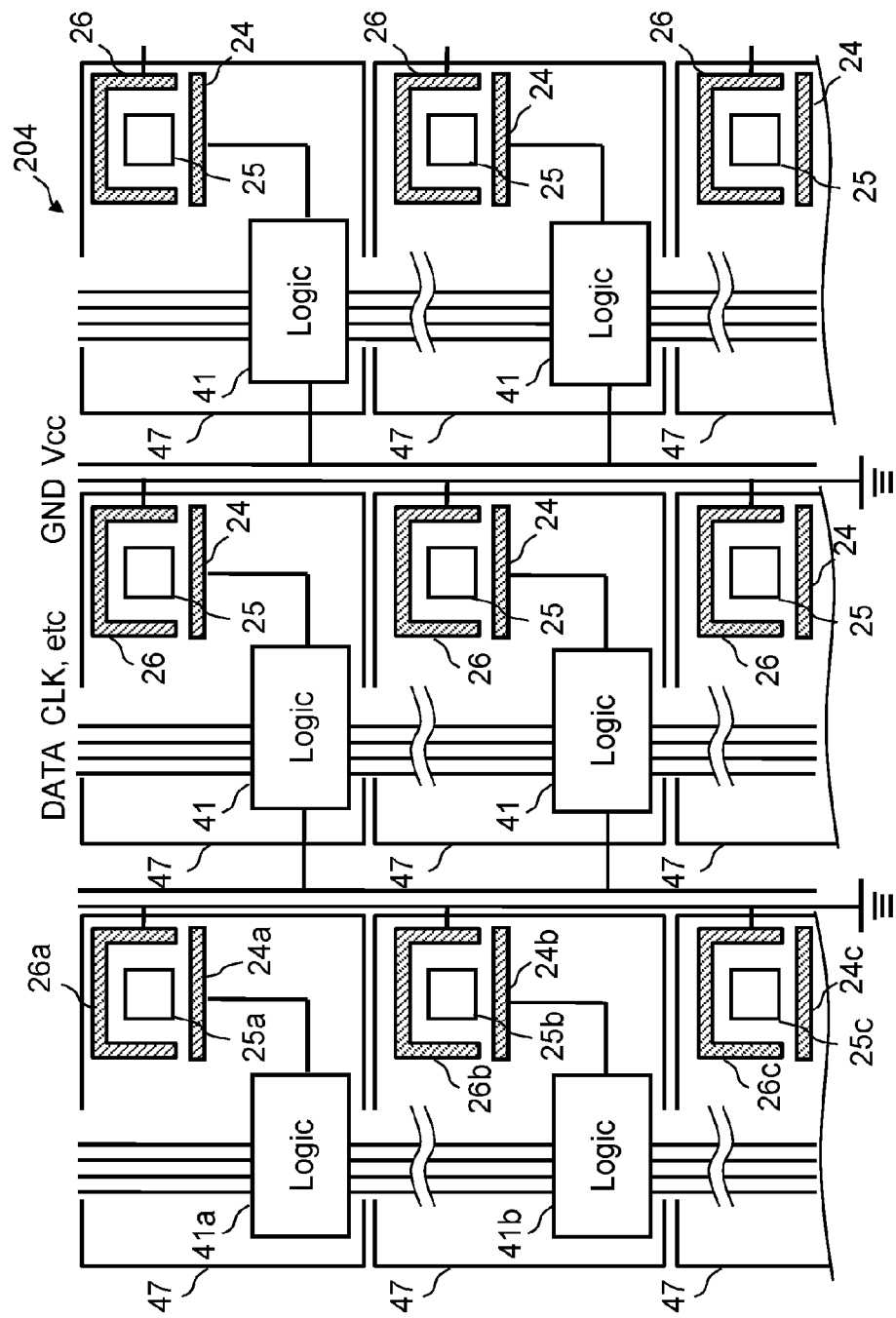
FIG. 3 is a top view conceptual diagram showing a part of a blanking aperture array unit according to the first embodiment.

FIG. 3 is a top view conceptual diagram showing apart of a blanking aperture array unit according to the first embodiment. In FIG. 3, the positional relation of electrodes 24 and 26 and the positional relation of a control circuit 41 are not in accordance with each other. As shown in FIG. 3, in the blanking aperture array mechanism 204, there are formed passage holes 25 (openings), through which multiple beams individually pass, at the positions each corresponding to each hole 22 of the forming aperture array substrate 203 of FIG. 2. Then, a pair of electrodes 24 and 26 (blanker: blanking deflector) for blanking deflection is arranged close to each passage hole 25 in a manner such that the electrodes 24 and 26 are opposite each other with respect to the passage hole 25 concerned. Moreover, close to each passage hole 25, there is arranged a control circuit 41 (logic circuit) for applying a deflection voltage to, for example, the electrode 24 for each passage hole 25. The other one (the electrode 26, for example) of the two electrodes 24 and 26 for each beam is connected to the grounded (earthed). Further, for example, 1-bit line for control signal is connected to each control circuit 41. In addition to the 1-bit line, for example, a clock signal line, a power source line, and the like are connected to each control circuit 41. An individual blanking system 47 composed of the electrodes 24 and 26 and the control circuit 41 is configured for each beam of multi-beams. A control signal for each control circuit 41 is output from the deflection control circuit 130. Moreover, a shift register to be described later is arranged in each control circuit 41, and for example, shift registers for beams in one row of n×m multi beams in the control circuit are connected in series. For example, control signals for beams in one row of the n×m multi beams are transmitted in series. For example, a control signal of each beam is stored in a corresponding control circuit 41 by clock signals of n times.

The electron beam 20 passing through a corresponding passage hole is independently deflected by the voltage applied to the two electrodes 24 and 26 being a pair. Blanking control is performed by this deflection. Blanking deflection is performed for each corresponding beam of the multi-beams. Thus, each of a plurality of blankers performs blanking deflection of a corresponding beam of the multi-beams having passed through a plurality of holes 22 (openings) of the forming aperture array substrate 203.

Figure 4:
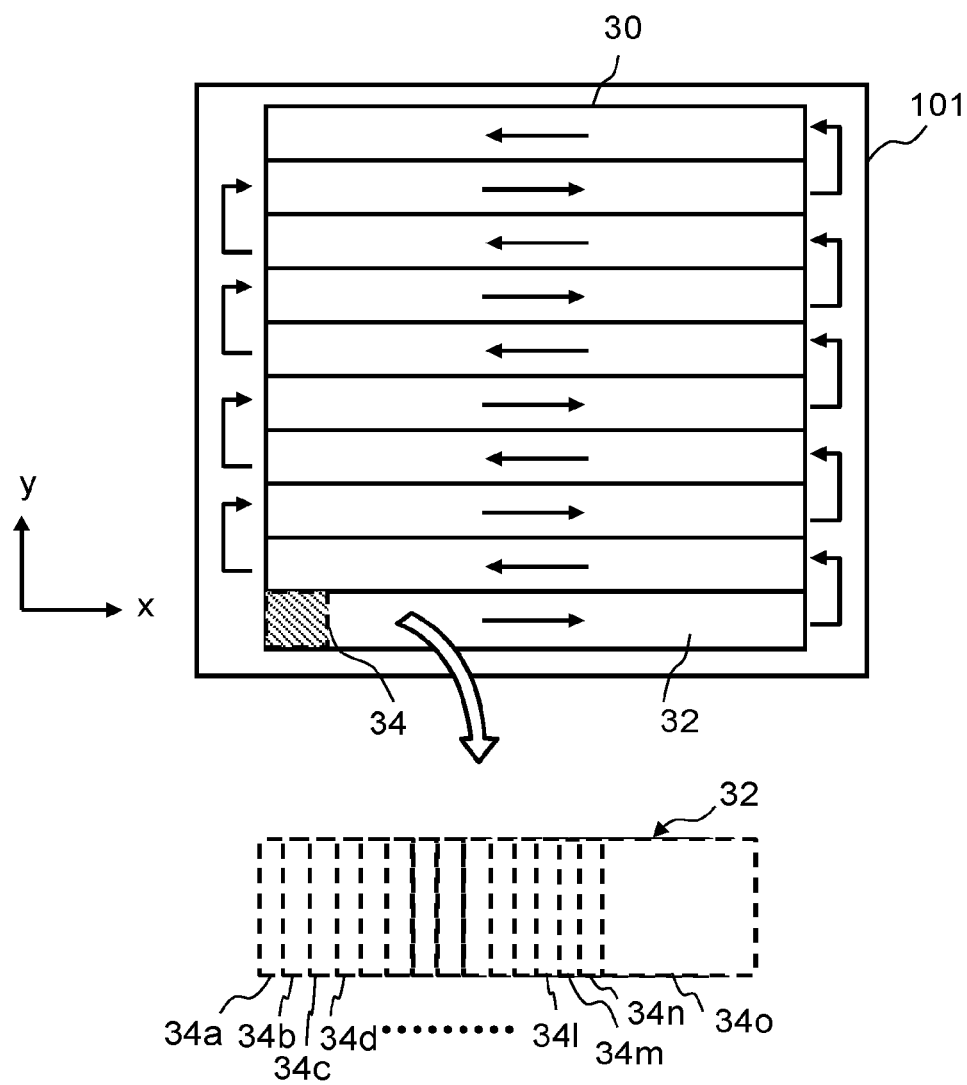
FIG. 4 is a conceptual diagram explaining an example of a writing operation according to the first embodiment.

FIG. 4 is a conceptual diagram explaining an example of a writing operation according to the first embodiment. As shown in FIG. 4, a writing region 30 of the target object 101 is virtually divided into a plurality of stripe regions 32 each in a strip shape and each having a predetermined width in the y direction, for example. First, the XY stage 105 is moved to make an adjustment such that an irradiation region 34 which can be irradiated with one irradiation of the multi-beams 20 is located at the left end of the first stripe region 32 or at a position more left than the left end, and then writing is started. For example, when writing the first stripe region 32 by moving the XY stage 105 in the −x direction, the writing advances relatively in the x direction. The XY stage 105 is moved, for example, continuously at a constant speed. After writing the first stripe region 32, again, an adjustment is made such that the irradiation region 34 which can be irradiated with one irradiation of the multi-beams 20 is located at the left end of the first stripe region 32 or at a position more left than the left end, and then, writing (exposing) is repeated times of the set multiplicity M (the number M of passes). Thereby, multiple exposure is performed to the first stripe region 32. Then, the multiple exposure of the first stripe region 32 is completed, the stage position is moved in the −y direction to make an adjustment such that the irradiation region 34 is located at the right end of the second stripe region 32 or at a position more right than the right end and located relatively in the y direction, and then, by moving the XY stage 105 in the x direction, for example, writing advances in the −x direction. Similarly, writing (exposing) is repeated times of the set multiplicity M (the number M of passes). Thereby, multiple exposure is performed to the second stripe region 32. That is, writing is performed while alternately changing the direction, such as performing writing (multiple exposure) in the x direction in the third stripe region 32, and in the −x direction in the fourth stripe region 32, and thus, the writing time can be reduced. However, the writing operation is not limited to the case of performing writing while alternately changing the direction, and it is also preferable to perform writing in the same direction when writing each stripe region 32. A plurality of shot patterns are generated at a time by one shot (total of divided shots to be described later) of multi-beams which have been formed by passing through each of the holes 22 of the forming aperture array substrate 203, that is, the number of shot patterns generated at a time is equal to the number of the holes 22 at the maximum.

Figure 5:
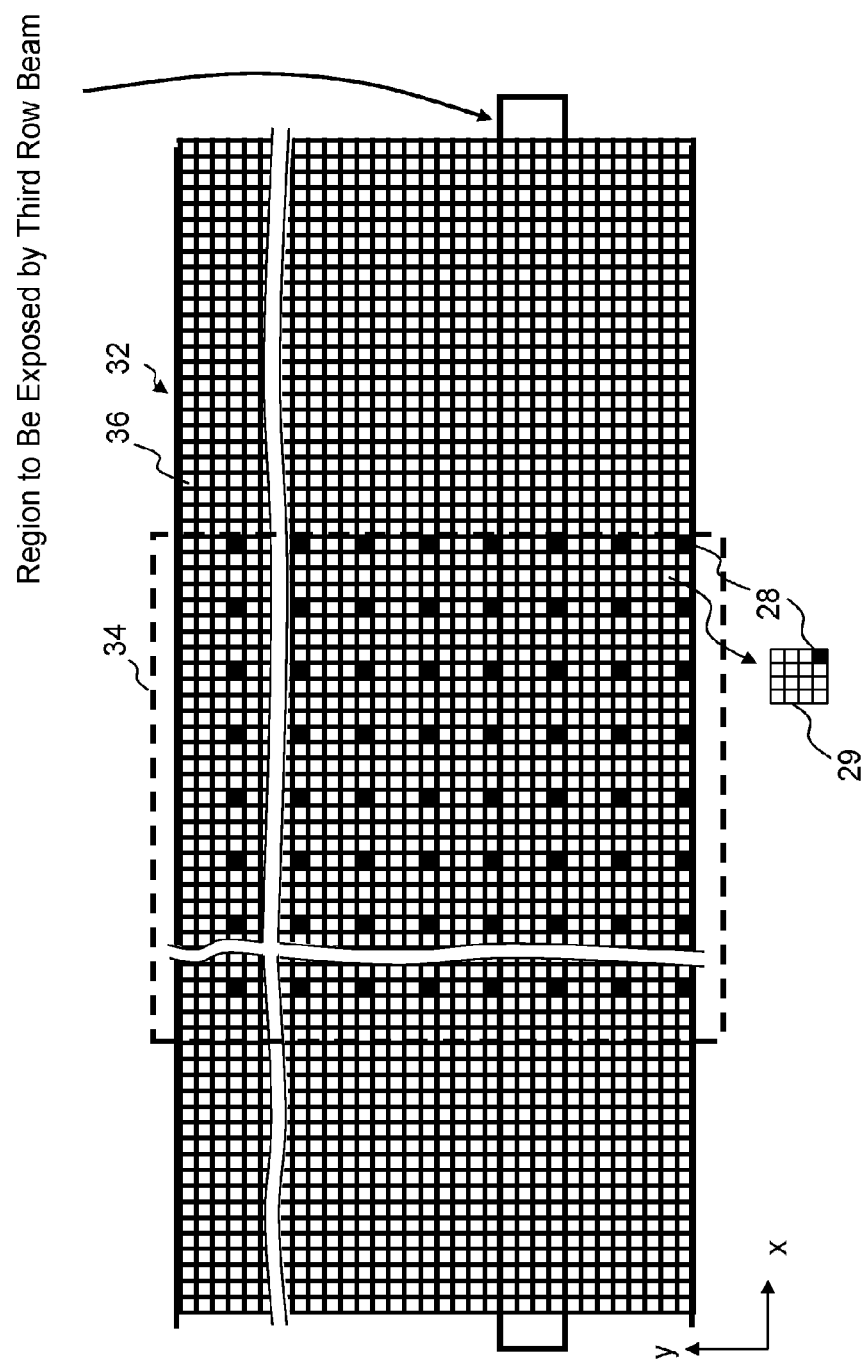
FIG. 5 shows an example of an irradiation region of multi-beams and a pixel to be written according to the first embodiment.

FIG. 5 shows an example of an irradiation region of multi-beams and a pixel to be written (writing target pixel) according to the first embodiment. In FIG. 5, the stripe region 32 is divided into a plurality of mesh regions by the size of a beam of multi-beams, for example. Each mesh region serves as a writing target pixel 36 (unit irradiation region, or writing position). The size of the writing target pixel 36 is not limited to the beam size, and it may be an arbitrary size regardless of the beam size. For example, it may be 1/n (n being an integer of 1 or more) of the beam size. In other words, a plurality of mesh regions obtained by dividing the writing region 30 of the target object 101 by the size of the unit irradiation region of a beam of multi-beams are defined as a plurality of pixels 36 (small regions). FIG. 5 shows the case where the writing region of the target object 101 is divided in the y direction into a plurality of stripe regions 32 by the width size being substantially the same as the size of the irradiation region 34 (writing field) which can be irradiated by one irradiation of the multi-beams 20, for example. The width of the stripe region 32 is not limited to this. It is also preferable for the width of the stripe region 32 to be n times (n being an integer of 1 or more) the size of the irradiation region 34. FIG. 5 shows the case of multi-beams of 512×512 (rows by columns). In the irradiation region 34, there are shown a plurality of pixels 28 (writing positions of beams) which can be irradiated by one irradiation of the multi-beams 20. In other words, the pitch between the adjacent pixels 28 is the pitch between beams of the multi-beams. In the example of FIG. 5, one grid 29 is a square region surrounded at four corners by four adjacent pixels 28, and it includes one of the four pixels 28. In the example of FIG. 5, each grid 29 is configured by 4×4 pixels.

Figure 6:
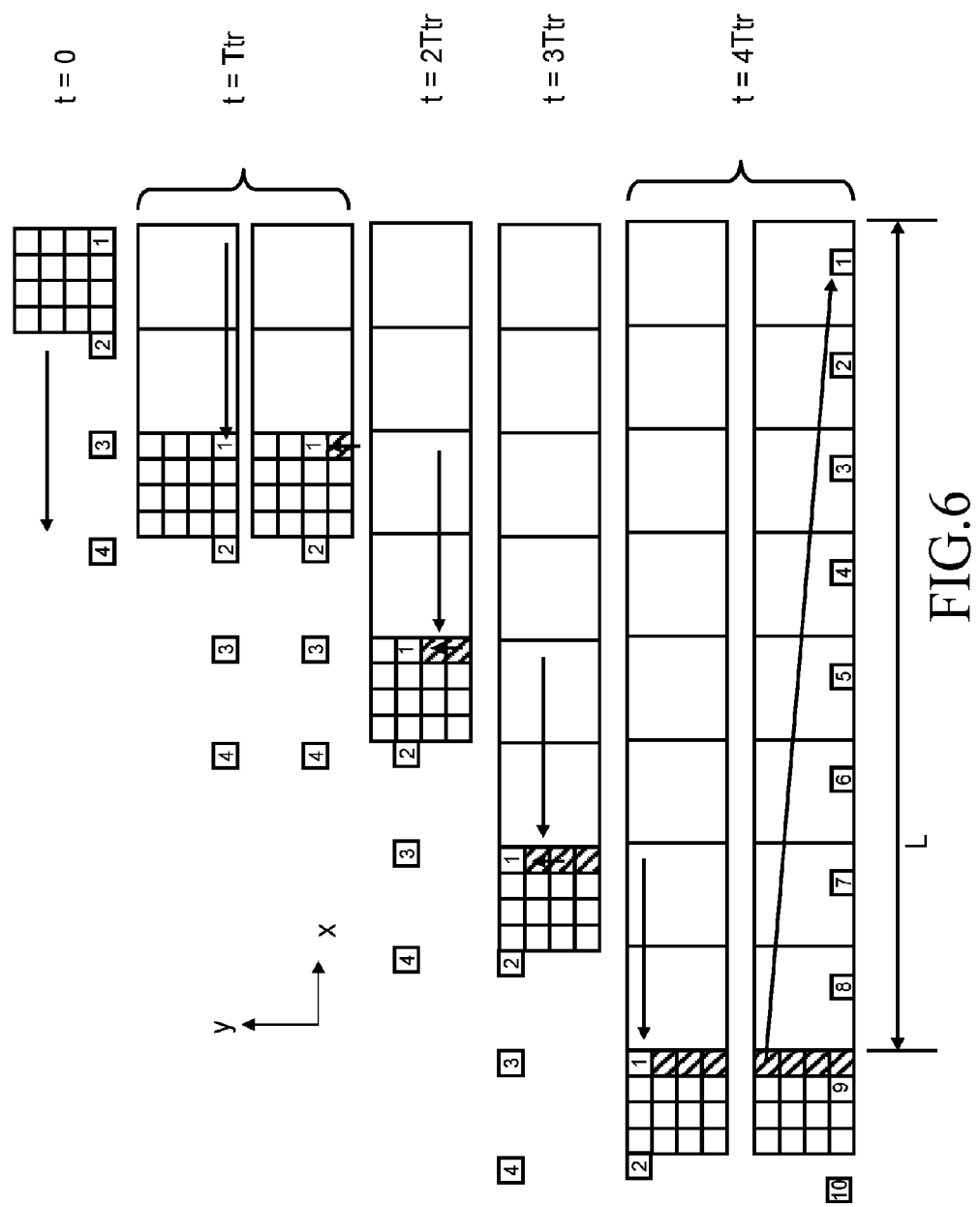
FIG. 6 illustrates an example of a writing method of multi-beams according to the first embodiment.

FIG. 6 illustrates an example of a writing method of multi-beams according to the first embodiment. FIG. 6 shows some grids to be written by respective beams at the coordinates (1, 3), (2, 3), (3, 3), . . . , (512, 3) in the third row in the y direction from the bottom in the multi-beams for writing the stripe region 32 shown in FIG. 5. In the example of FIG. 6, while the XY stage 105 moves the distance of eight beam pitches, four pixels are written (exposed), for example. In order that the relative position between the irradiation region 34 and the target object 101 may not shift by the movement of the XY stage 105 while these four pixels are written (exposed), the irradiation region 34 is made to follow the movement of the XY stage 105 in a manner where the entire multi-beams 20 is collectively deflected by the deflector 208. In other words, tracking control is performed. In the example of FIG. 6, one tracking cycle is executed by writing (exposing) four pixels while moving the distance of eight beam pitches.

Specifically, the stage position detector 139 measures the position of the XY stage 105 by irradiating a laser onto the mirror 210 and receiving a catoptric light from the mirror 210. The measured position of the XY stage 105 is output to the control computer 110. In the control computer 110, the writing control unit 84 outputs the position information on the XY stage 105 to the deflection control circuit 130. The deflection control circuit 130 calculates deflection amount data (tracking deflection data) for performing beam deflection to follow the movement of the XY stage 105. The tracking deflection data being a digital signal is output to the DAC amplifier 134. The DAC amplifier 134 converts the digital signal to an analog signal and amplifies it to be applied as a tracking deflection voltage to the main deflector 208.

The writing mechanism 150 illuminates each pixel 36 with a corresponding beam in the ON state in the multi-beams 20 during a writing time corresponding to each pixel 36 within the maximum writing time Ttr of the irradiation time of each beam of the multi-beams of the shot concerned (total of divided shots to be described later). According to the first embodiment, one-time shot (one pass shot) is divided into a plurality of divided shots to be described later, and these plurality of divided shots are performed during one shot operation. First, regarding a plurality of divided shots as one shot, the operation of each shot is described below.

In the example of FIG. 6, during from the time t=0 to t=Ttr being the maximum writing time, using a beam (1) of coordinates (1, 3), beam irradiation of the first shot composed of a plurality of divided shots is performed to the first pixel from the right in the bottom row of the grid 29 concerned ("target grid", or "grid of interest"). For example, irradiation of a plurality of divided shots is performed with a beam (1). The XY stage 105 moves, for example, two beam pitches in the −x direction during from the time t=0 to t=Ttr. During this time period, the tracking operation is continuously performed.

After the maximum writing time Ttr of the shot of the pass concerned has passed since the start of beam irradiation of the shot of the pass concerned, while the beam deflection for tracking control is being continuously performed by the deflector 208, the writing position (previous writing position) of each beam is shifted to a next writing position (current writing position) of each beam by collectively deflecting the multi-beams 20 by the deflector 209, which is performed in addition to the beam deflection for tracking control. In the example of FIG. 6, when the time becomes t=Ttr, the pixel to be written (writing target pixel) is shifted from the first pixel from the right in the bottom row of the grid 29 concerned to the first pixel from the right in the second row from the bottom. Since the XY stage 105 is moving at a fixed speed also during this time period, the tracking operation is continuously performed.

Then, while the tracking control is continued, respective beams in the ON state in the multi-beams 20 are applied to shifted writing positions corresponding to the respective beams during a writing time corresponding to each of the respective beams within a maximum writing time Ttr of the shot concerned. In the example of FIG. 6, the first pixel from the right in the second row from the bottom of the grid 29 concerned is irradiated by the second shot using the beam (1) of coordinates (1, 3) during the time from t=Ttr to t=2Ttr, for example. The XY stage 105 moves two beam pitches in the −x direction during the time from t=Ttr to t=2Ttr, for example. During this time period, the tracking operation is continuously performed.

In the example of FIG. 6, when the time becomes t=2Ttr, the pixel to be written (writing target pixel) is shifted from the first pixel from the right in the second row from the bottom of the grid 29 concerned to the first pixel from the right in the third row from the bottom by collectively deflecting the multi-beams by the deflector 209. Since the XY stage 105 is moving also during this time period, the tracking operation is continuously performed. Then, the first pixel from the right in the third row from the bottom of the grid 29 concerned is irradiated by the third shot using the beam (1) of coordinates (1, 3) during the time from t=2Ttr to t=3Ttr, for example. The XY stage 105 moves two beam pitches in the −x direction during the time from t=2Ttr to t=3Ttr, for example. During this time period, the tracking operation is continuously performed. When the time becomes t=3Ttr, the pixel to be written (writing target pixel) is shifted from the first pixel from the right in the third row from the bottom of the grid 29 concerned to the first pixel from the right in the fourth row from the bottom by collectively deflecting the multi-beams by the deflector 209. Since the XY stage 105 is moving also during this time period, the tracking operation is continuously performed. Then, the first pixel from the right in the fourth row from the bottom of the grid 29 concerned is irradiated by the fourth shot using the beam (1) of coordinates (1, 3) during the time from t=3Ttr to t=4Ttr, for example. The XY stage 105 moves two beam pitches in the −x direction during the time from t=3Ttr to t=4Ttr, for example. During this time period, the tracking operation is continuously performed. By the process described above, writing of the pixels in the first column from the right of the grid 29 concerned has been completed.

In the example of FIG. 6, after emitting a corresponding beam while switching the beam to the writing position of each beam which has been shifted three times from the initial position, the DAC amplifier 134 returns the tracking position to the start position of tracking where the tracking control was started, by resetting the beam deflection for tracking control. In other words, the tracking position is returned in the opposite direction to the direction of the stage movement. In the example of FIG. 6, when the time becomes t=4Ttr, tracking of the grid 29 concerned is released (removed), and the beam is swung back to a new target grid which has been shifted by eight beam pitches in the x direction. Although the beam (1) of the coordinates (1, 3) has been described in the example of FIG. 6, writing is also similarly performed for each grid corresponding to a beam of other coordinates. That is, a beam of coordinates (n, m) completes writing of pixels in the first column from the right of a corresponding grid when the time becomes t=4Ttr. For example, a beam (2) of coordinates (2, 3) completes writing of pixels in the first column from the right of a grid adjacent in the −x direction to the grid 29 concerned for the beam (1) of FIG. 6.

Since writing of the pixels in the first column from the right of each grid has been completed, in a next tracking cycle after resetting the tracking, the deflector 209 performs deflection such that the writing position of each corresponding beam is adjusted (shifted) to the second pixel from the right in the first row from the bottom of each grid.

As described above, each shot (a plurality of divided shots) of the pass concerned is performed while shifting the irradiation position pixel by pixel by the deflector 209, in a state such that the relative position of the irradiation region 34 to the target object 101 is controlled by the deflector 208 to be unchanged during the same tracking cycle. Then, after finishing one tracking cycle and returning the tracking position of the irradiation region 34, as shown in the lower part of FIG. 4, the first shot position is adjusted to be the position shifted by one pixel, for example. Then, while performing a next tracking control, each shot is performed shifting the irradiation position by one pixel by the deflector 209. By repeating this operation during writing the stripe region 32, the position of the irradiation region 34 is shifted one by one, such as from 34a to 34o, to perform writing of the stripe region concerned.

Figure 7:
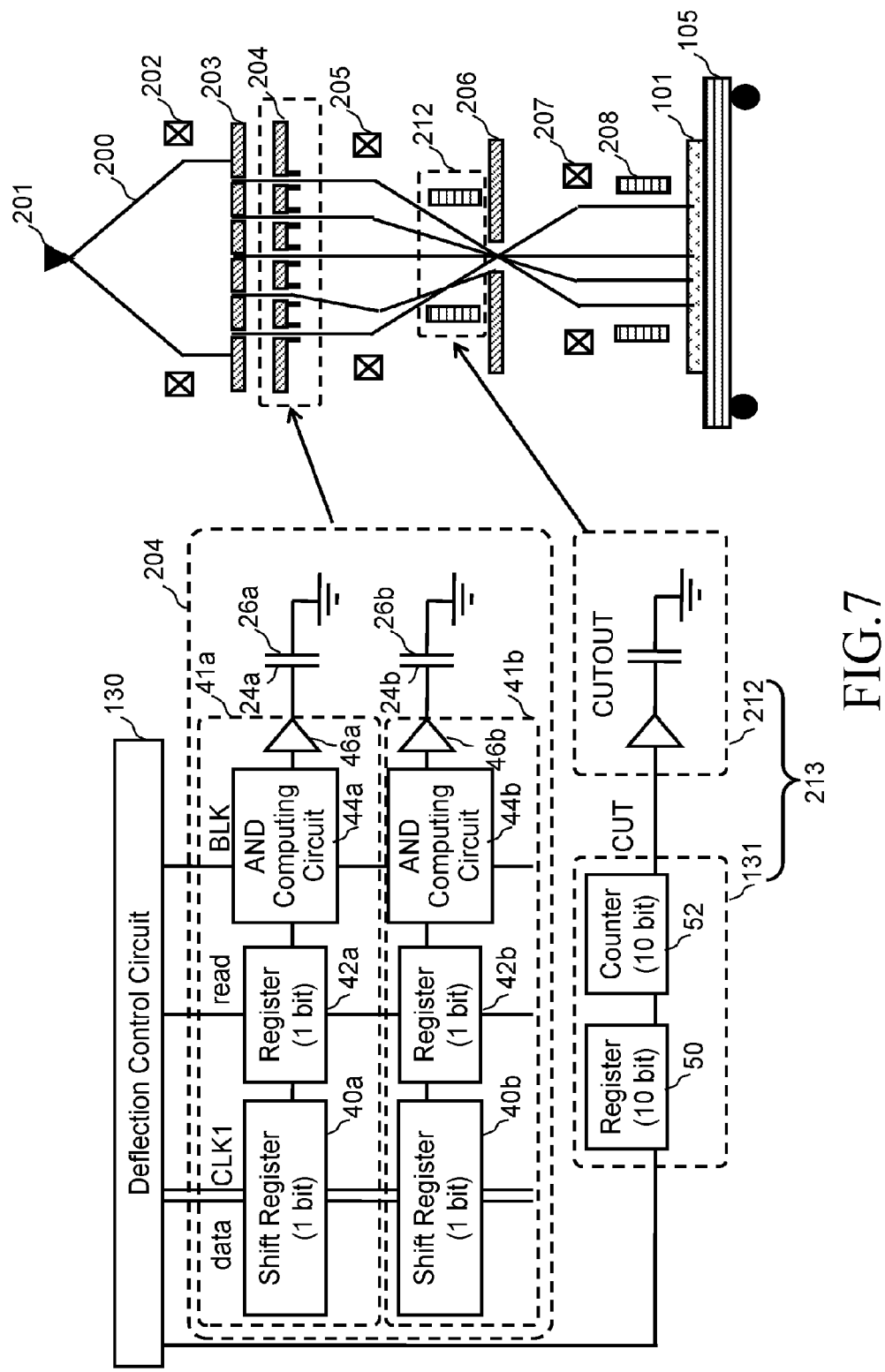
FIG. 7 is a schematic diagram showing the internal configuration of an individual blanking control circuit and a common blanking control circuit according to the first embodiment.

FIG. 7 is a schematic diagram showing the internal configuration of an individual blanking control circuit and a common blanking control circuit according to the first embodiment. As shown in FIG. 7, a shift register 40, a register 42, an AND computing unit 44, and an amplifier 46 are arranged in each logic circuit 41 for controlling individual blanking arranged in the blanking aperture array mechanism 204 in the body of the writing apparatus 100. The AND computing unit 44 may be omitted. According to the first embodiment, for example, a 1-bit control signal is used for individual blanking control for each beam, which has conventionally been controlled by, for example, a 10-bit control signal. That is, a 1-bit control signal is input/output into/from the shift register 40, register 42, and AND computing unit 44. Since the amount of information of the control signal is small, the installation area of the control circuit can be made small. In other words, even when a logic circuit is arranged on the blanking aperture array mechanism 204 whose installation space is small, more beams can be arranged at a smaller beam pitch. This increases the amount of current passing through the blanking aperture array mechanism 204, and therefore, improves the writing throughput.

Moreover, an amplifier is arranged in the deflector 212 for common blanking, and a register 50 and a counter 52 are arranged in the logic circuit 131. These do not simultaneously perform several different controls, and therefore, it is sufficient to use one circuit to perform ON/OFF control. Accordingly, even when arranging a circuit for a high speed response, no problem occurs with respect to restriction on the installation space and the current to be used in the circuit. Therefore, this amplifier operates at very high speed compared to an amplifier realizable on the blanking aperture. This amplifier is controlled by a 10-bit control signal, for example. That is, for example, a 10-bit control signal is input/output to/from the register 50 and the counter 52. A common blanking mechanism 213 is configured by the deflector 212 and the logic circuit 131.

According to the first embodiment, blanking control of each beam is performed by using both the beam ON/OFF control by each logic circuit 41 for individual blanking control and the beam ON/OFF control by the logic circuit 131 for common blanking control that collectively performs blanking control of the entire multi beams.

Figure 8:
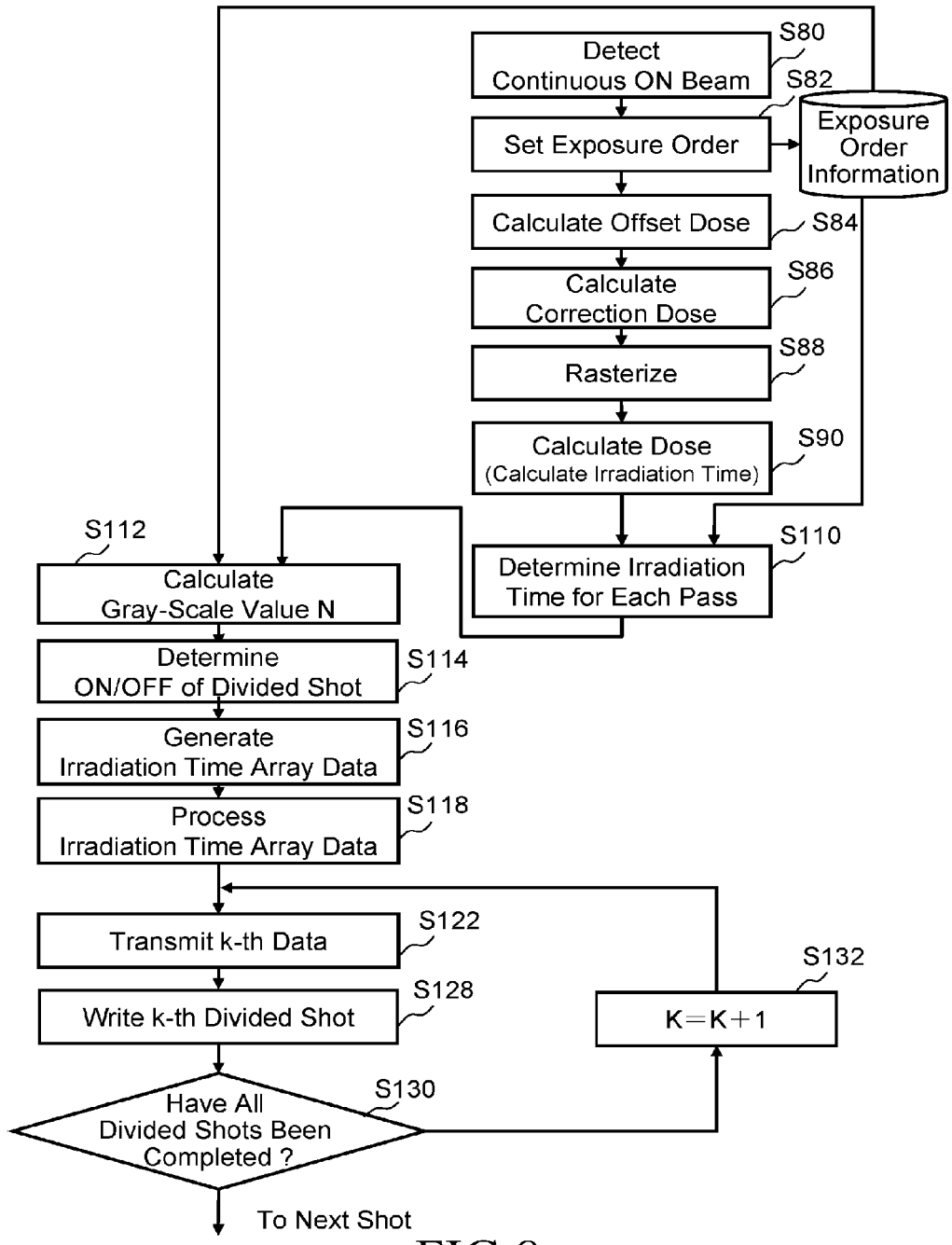
FIG. 8 is a flowchart showing main steps of a writing method according to the first embodiment.

FIG. 8 is a flowchart showing main steps of a writing method according to the first embodiment. As shown in FIG. 8, the writing method of the first embodiment executes a series of steps: a continuous ON beam detection step (S80), an exposure order setting step (S82), an offset dose calculation step (S84), a correction dose calculation step (S86) for each pixel, a rasterization step (S88), a dose calculation step (irradiation time calculation step) (S90) for each pixel, an irradiation time determination step (S110) for each pass of multiple exposure, a gray-scale value N calculation step (S112), a divided shot ON/OFF determination step (S114), an irradiation time array data generation step (S116), an irradiation time array data processing step (S118), a k-th data transmission step (S122), a k-th divided shot step (S128), a determination step (S130), and an addition step (S132).

In the continuous ON beam detection step (S80), the detection unit 71 detects a continuous ON beam (defective beam) in multi-beams. Specifically, the individual blanking mechanism 47 controls one of the multi-beams to be beam ON one by one, and all of the remaining others to be beam OFF. Then, the control is switched from this state to a state in which the detection target beam is made to be OFF. Then, in that case, a beam whose current is detected by the Faraday cup 106 in spite of having been switched from beam ON to beam OFF is detected as a continuous ON beam (defective beam). By checking each of the multi-beams by this method in order, it is possible to detect whether there is a continuous ON beam (defective beam) or not and where a continuous ON beam is located.

In the exposure order setting step (S82), the exposure order setting unit 73 sets the order of exposure, namely, which beam of multi-beams takes charge of which pixel 36 in accordance with which order. In multi-beam writing, as described with reference to FIGS. 4 to 6, writing of the stripe region 30 proceeds by repeating the tracking cycle while shifting the pixel to be written. It depends on the writing sequence which beam of the multi-beams irradiates which pixel 36. The exposure order setting unit 73 sets the order of exposure in accordance with the writing sequence. Exposure order information is stored in the storage device 142. The order of exposure is preferably set such that the number m (m being a natural number) of continuous ON beams (defective beams) exposing one pixel 36 is to be as small as possible.

In the offset dose calculation step (S84), the offset dose calculation unit 75 calculates an offset dose $D_{off}$ to irradiate all of a plurality of pixels by multiplying one beam dose equivalent to the maximum irradiation time Ttr of multi-beams per pass in multiple writing by the maximum number m of defective beams being always ON to irradiate one of a plurality of the pixels, which are obtained by dividing the writing region 30 of the target object 101 by the unit irradiation region size of a beam of multi-beams. The continuous ON beam (defective beam) is generated when a short-circuit (conduction) occurs between the two electrodes 24 and 26 of the individual blanking mechanism 47 or when a deflection voltage from the amplifier 46 becomes equivalent to the ground potential because of failure of the control circuit 41. That is, since no electric potential difference is generated between the electrodes 24 and 26, the beam cannot be deflected, and therefore it is impossible to make the beam OFF. According to the first embodiment, a multi-beam one pass shot (one-time shot) of the maximum irradiation time Ttr is divided into n divided shots which continuously irradiate the same position and each of which has a different irradiation time. The irradiation time (exposure time) of the n divided shots is highly accurately controlled by the common blanking mechanism 213 to be described later. Therefore, with respect to a continuous ON beam (defective beam), even if the individual blanking mechanism 47 for the beam is out of order, it is possible to highly precisely control by the common blanking mechanism 213 such that the beam becomes ON during the maximum irradiation time Ttr of one pass shot (one-time shot) which is the total of the irradiation time of the n divided shots. Then, according to the first embodiment, a dose is set, as the offset dose, by multiplying one beam dose equivalent to the maximum irradiation time Ttr of multi-beams per pass in multiple writing by the maximum number m of defective beams being always ON to irradiate one pixel 36. As will be described later, the offset dose is uniformly applied to all the pixels. Thus, the offset dose calculation unit 75 calculates an offset dose $D_{off}$. Specifically, the offset dose $D_{off}$ can be calculated by multiplying a certain value by the maximum number m of continuous ON beams (defective beams) to irradiate one pixel 36, where the certain value is obtained by multiplying a current density J by a time t' which is calculated by dividing the maximum irradiation time $t_{max}$ of a beam to irradiate one pixel 36 by the multiplicity M. The offset dose $D_{off}$ can be defined by the following equation (1). If the maximum number m of continuous ON beams (defective beams) is zero, the offset dose $D_{off}$ becomes zero. Since usually the maximum number m of continuous ON beams (defective beams) to irradiate one pixel 36 may be one, m can be omitted in such a case. When m is two or more, it turns out that there exists a pixel 36 for which a continuous ON beam (defective beam) is used in two or more passes in the number M of all the passes in multiple writing.

$$D_{off}=(t_{max}m/M)J \quad (1)$$

In the correction dose calculation step (S86) for each pixel, first, the p calculation unit 60 virtually divides the writing region (here, for example, stripe region 32) into a plurality of proximity mesh regions (mesh regions for proximity effect correction calculation) by a predetermined size. The size of the proximity mesh region is preferably about 1/10 of the influence radius of the proximity effect, such as about 1 μm. The ρ calculation unit 60 reads writing data from the storage device 140, and calculates, for each proximity mesh region, a pattern area density ρ of a pattern arranged in the proximity mesh region concerned.

Next, the $D_p$ calculation unit 62 calculates, for each proximity mesh region, a proximity effect correction irradiation coefficient $D_p(x)$ (correction dose) for correcting a proximity effect. The proximity effect correction irradiation coefficient $D_p(x)$ can be defined by the following equation (2) of a threshold model using a backscatter coefficient a dose threshold $D_{th}$ of the threshold model, a distribution function $g_p(x)$, and an offset dose $D_{off}$. The term of the offset dose is standardized and defined, as shown in the equation (2), using the backscatter coefficient η and the dose threshold $D_{th}$ of the threshold model. In addition, the position x indicates a vector. Alternatively, the position x may be rewritten as (x, y). In such a case, needless to say, the integral term of the equation (2) should be integrated in the y direction as well as in the x direction.

$$\frac{D_p(x)}{2} + \eta \int D_p(x')\rho(x')g_p(x'-x)dx' + \frac{D_{off}(1/2+\eta)}{D_{th}} = \frac{1}{2} + \eta \quad (2)$$

The dose equation of the threshold model according to the first embodiment is defined using the forward scatter dose of the first term in the left hand side, the backscatter dose of the second term in the left hand side, and the offset dose of the third term in the left hand side, as shown in the equation (2). By solving the dose equation of the threshold model, an unknown proximity effect correction irradiation coefficient $D_p(x)$ can be obtained.

In the rasterization step (S88), the ρ' calculation unit 64 calculates, for each pixel 36, a pattern area density ρ' in the pixel 36 concerned. The mesh size of ρ' is, for example, the same as the size of a pixel 28.

In the dose calculation step (irradiation time calculation step) (S90) for each pixel, the D calculation unit 66 calculates, for each pixel 36, an incident dose D(x) to irradiate the pixel 36 concerned, in addition to the offset dose $D_{off}$. The incident dose D(x) can be calculated by multiplying a pre-set reference dose $D_{base}$, a proximity effect correction irradiation coefficient $D_p$, and a pattern area density ρ', for example. Specifically, the incident dose D(x) can be defined by the following equation (3). The reference dose $D_{base}$ can be defined by $D_{th}/(1/2+\eta)$.

$$D(x) = \frac{D_{th}}{(1/2+\eta)} D_p(x)\rho'(x) \quad (3)$$

Thus, the incident dose D(x) is obtained by using a value which is calculated by solving the dose equation (2) of the threshold model using the term of a forward scatter dose, the term of a backscatter dose, and the term of the offset dose. The incident dose D(x) is preferably obtained to be proportional to the pattern area density calculated for each pixel 36.

Next, the t calculation unit 68 calculates, for each pixel 36, an electron beam irradiation time $t_r(x)$ for making the calculated incident dose D(x) incident on the pixel 36 concerned. The irradiation time $t_r(x)$ can be calculated by dividing the incident dose D(x) by the current density J. Therefore, the irradiation time t(x) (an irradiation time equivalent to a total dose) for all the passes of each pixel is the sum of the irradiation time t' equivalent to the offset dose and the irradiation time $t_r(x)$ equivalent to the remaining incident dose D(x), and can be defined by the following equation (4).

$$t(x)=t'+t_r(x) \quad (4)$$

In the irradiation time determination step (S110) for each pass of multiple exposure, the irradiation time $t_i$ determination unit 77 inputs exposure order information in order to acquire information on the pixel 36 which is exposed by a continuous ON beam (defective beam) and the pass in the case that the pixel 36 is exposed by the continuous ON beam (defective beam). Then, the irradiation time $t_i$ determination unit 77 determines, for each pixel 36, an irradiation time $t_i(x)$ of each pass, based on the information.

Figure 9A:
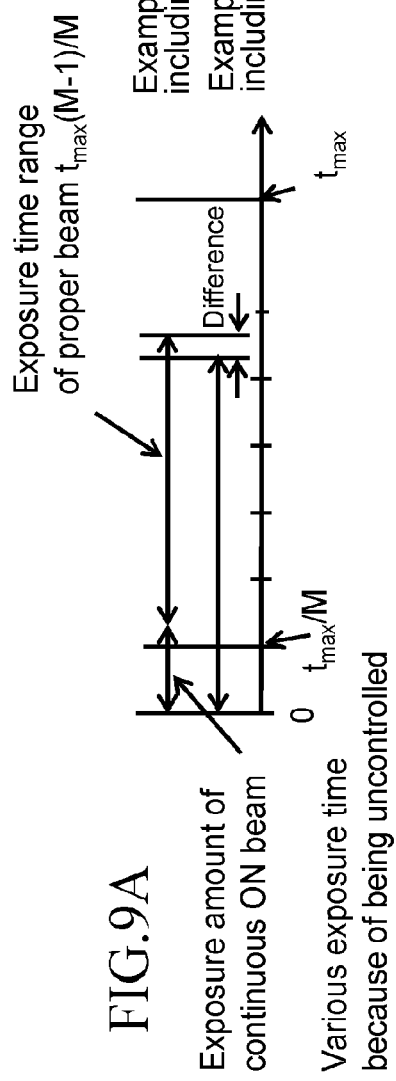
FIGS. 9A and 9B show an example of an exposure time of multiple exposure in a comparative example to the first embodiment.
Figure 9B:
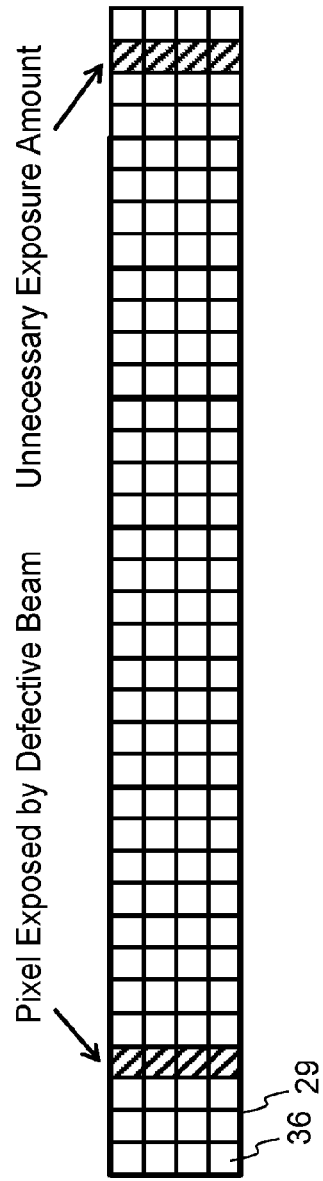

FIGS. 9A and 9B show an example of an exposure time of multiple exposure in a comparative example to the first embodiment. In this example, the exposure time is controlled by blanking of the blanking aperture array mechanism 204 without using the common blanking mechanism 213. FIG. 9A shows the comparative example to the first embodiment, where in M=7 time exposures, for example, one exposure is performed using a continuous ON beam (defective beam), and the remaining M-1 time exposures are performed using proper (normal) beams as described above. However, since the continuous ON beam performs irradiation even during standby time for switching the beam to another pixel, the error of the irradiation time increases compared to the pixel exposed using no continuous ON beam (defective beam). Consequently, the pixel exposed by the continuous ON beam (also called a defective beam or a broken beam) shown in FIG. 9B is excessively exposed by the dose of the error. FIG. 9B shows the case using the writing order of FIG. 6.

Figure 10A:
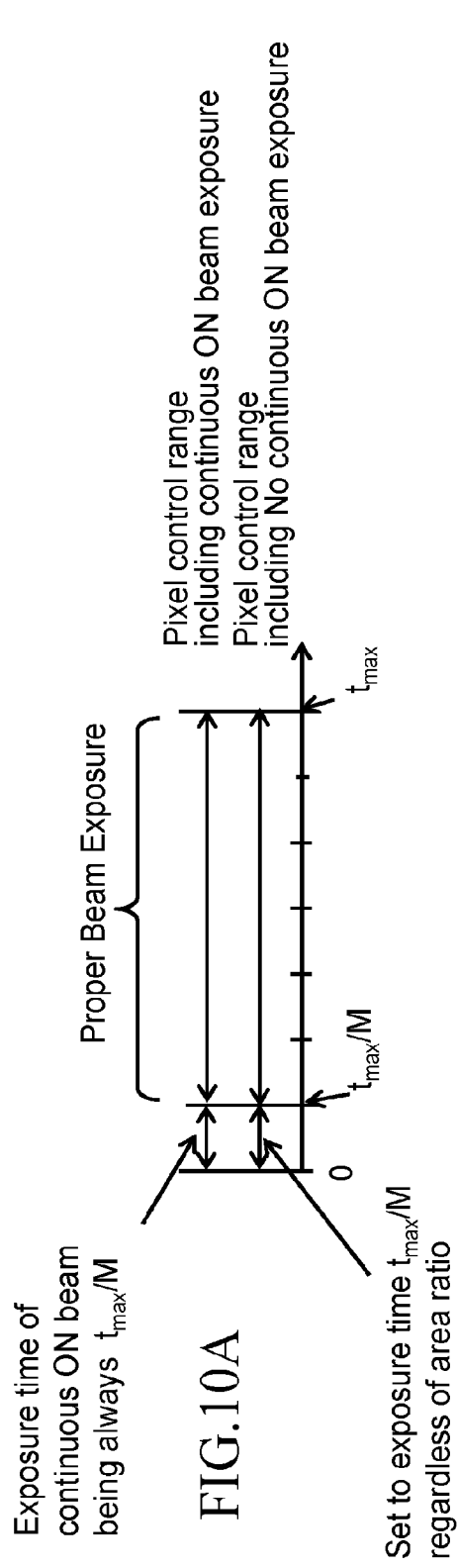
FIGS. 10A and 10B show an example of an exposure time of multiple exposure according to the first embodiment.
Figure 10B:
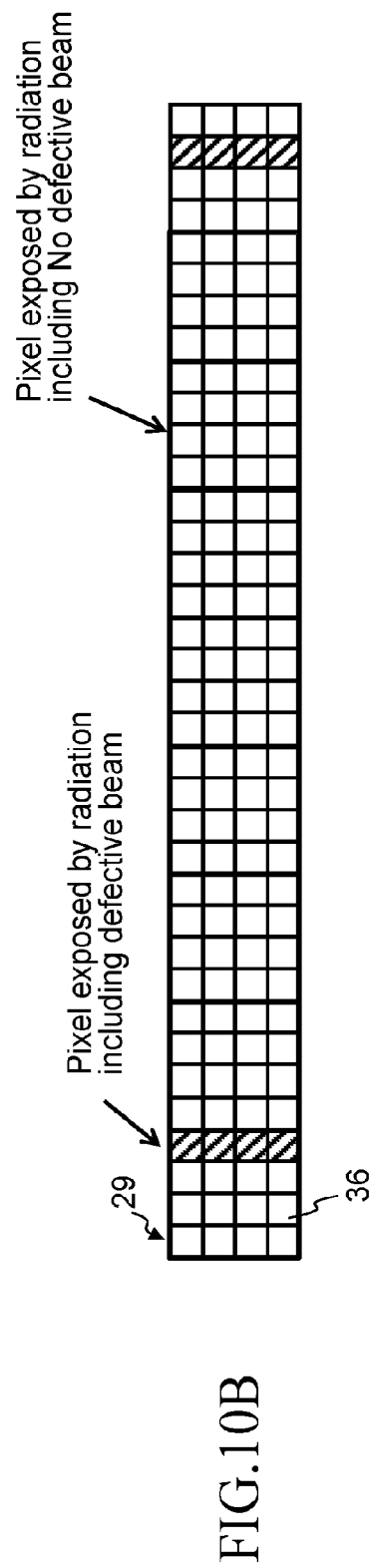

FIGS. 10A and 10B show an example of an exposure time of multiple exposure according to the first embodiment. In this example, blanking of the common blanking mechanism 213 controls the exposure time and the blanking aperture array mechanism 204 switches the ON/OFF state of each beam. In the case of FIG. 10A, in M time exposures, for example, one exposure is performed using a continuous ON beam (defective beam), and the remaining M-1 time exposures are performed using proper beams. According to the first embodiment, the irradiation time of a continuous ON beam (defective beam) can be controlled to be an irradiation time t' equivalent to the offset dose by the common blanking mechanism 213. Therefore, with respect to the pixel 36 exposed with a continuous beam (defective beam), if setting the irradiation time of the remaining M-1 time exposures to be an irradiation time $t_r(x)$ equivalent to the incident dose D(x), the irradiation time t(x) for all the passes of the pixel concerned can be controlled with a great precision. On the other hand, with respect to the pixel 36 exposed using no continuous on beam (defective beam), if setting, in M time exposures, one irradiation time to be an irradiation time t' equivalent to the offset dose, and the irradiation time of the remaining M-1 time exposures to be an irradiation time $t_r(x)$ equivalent to the incident dose D(x) irrespective of the proximity effect correction irradiation coefficient $D_p$ and the pattern area density ρ', the irradiation time t(x) for all the passes of the pixel concerned can be controlled with great precision. Consequently, even with respect to the pixel exposed by a continuous ON beam (also called a defective beam or a broken beam) shown in FIG. 10B, exposure can be performed with a highly accurately dose. Therefore, in the case of FIG. 10A, with respect to the pixel 36 exposed with a continuous ON beam (defective beam), the irradiation time $t_i$ determination unit 77 determines, in M time exposures, the irradiation time $t_i(x)$ of one exposure exposed with a continuous ON beam (defective beam) to be an irradiation time t' equivalent to the offset dose, and determines to assign an irradiation time $t_r(x)$ equivalent to the incident dose D(x) to each irradiation time $t_i(x)$ of the remaining M-1 time exposures. Then, with respect to the pixel 36 exposed using no continuous ON beam (defective beam), the irradiation time $t_i$ determination unit 77 determines to allot the irradiation time t(x) to each irradiation time $t_i(x)$ of M time exposures. For example, the irradiation time $t_i$ determination unit 77 determines, in M time exposures, the irradiation time $t_i(x)$ of one exposure to be an irradiation time t' equivalent to the offset dose, and determines to allot an irradiation time $t_r(x)$ equivalent to the incident dose D(x) to each irradiation time $t_i(x)$ of the remaining M-1 time exposures.

Figure 11:
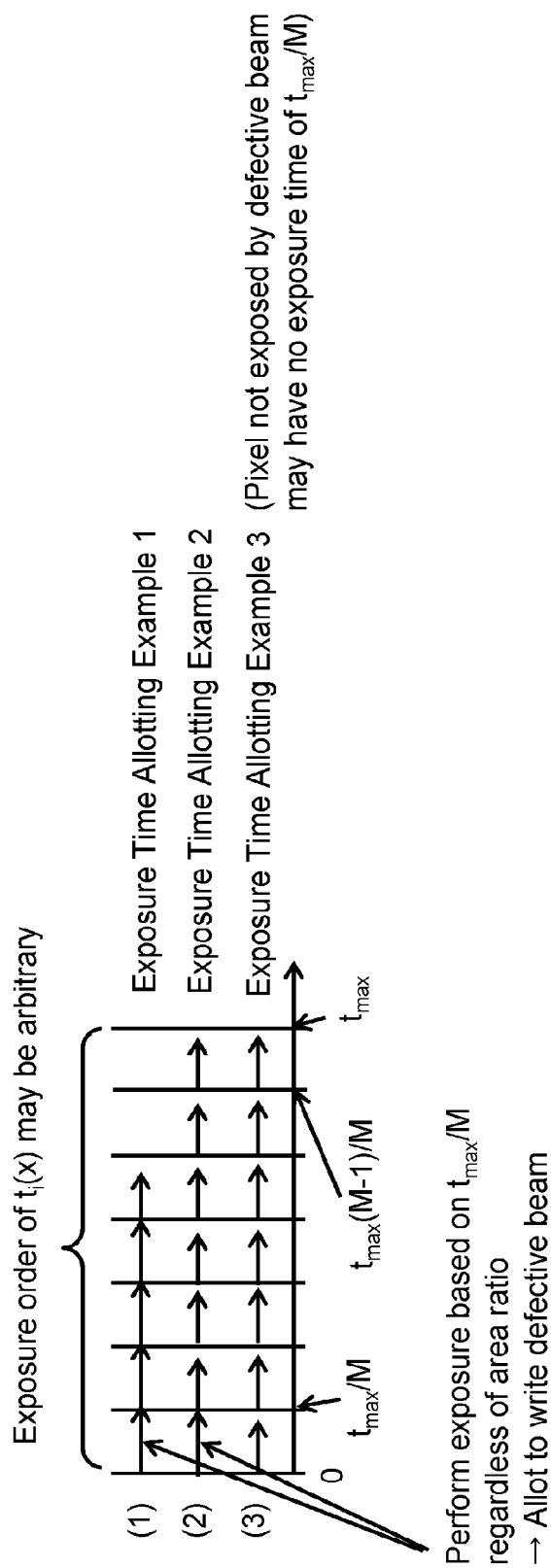
FIG. 11 shows an example of a method for determining an exposure time of each pass of multiple exposure according to the first embodiment.

FIG. 11 shows an example of a method for determining an exposure time of each pass of multiple exposure according to the first embodiment. In the exposure time allotting example (1), the irradiation time $t_i(x)$ of passes as many as possible is set to be the time t' obtained by dividing the maximum irradiation time $t_{max}$ to irradiate one pixel 36 with a beam by the multiplicity M, and the remaining time is allotted to one pass. Therefore, in the exposure time allotting example (1), a pass of beam OFF may exist depending on pass. Moreover, in the exposure time allotting example (1), with respect to the pixel 36 exposed with a continuous ON beam (defective beam), it is needless to say that the irradiation time $t_i(x)$ of the pass using a continuous ON beam (defective beam) is set to be the time t'. In the exposure time allotting example (2), in M time exposures, the irradiation time $t_i(x)$ of one exposure is set to be the irradiation time t' equivalent to the offset dose, and each irradiation time $t_i(x)$ of the remaining M-1 time exposures is set to be a value obtained by dividing the irradiation time $t_r(x)$ equivalent to the incident dose D(x) by M-1. Therefore, a pass of beam OFF does not exist in the exposure time allotting example (2). Moreover, in the exposure time allotting example (2), with respect to the pixel 36 exposed with a continuous ON beam (defective beam), it is needless to say that the irradiation time $t_i(x)$ of the pass using a continuous ON beam (defective beam) is set to be the time t'. In the exposure time allotting example (3), the irradiation time $t_i(x)$ of M time exposures is set to be a value obtained by dividing the irradiation time t(x) for all the passes (the irradiation time t(x) equivalent to a total dose between the incident dose and the offset dose) by the multiplicity M. Moreover, in the exposure time allotting example (3), the pixel 36 exposed with a continuous ON beam (defective beam) is not used.

Figure 12:
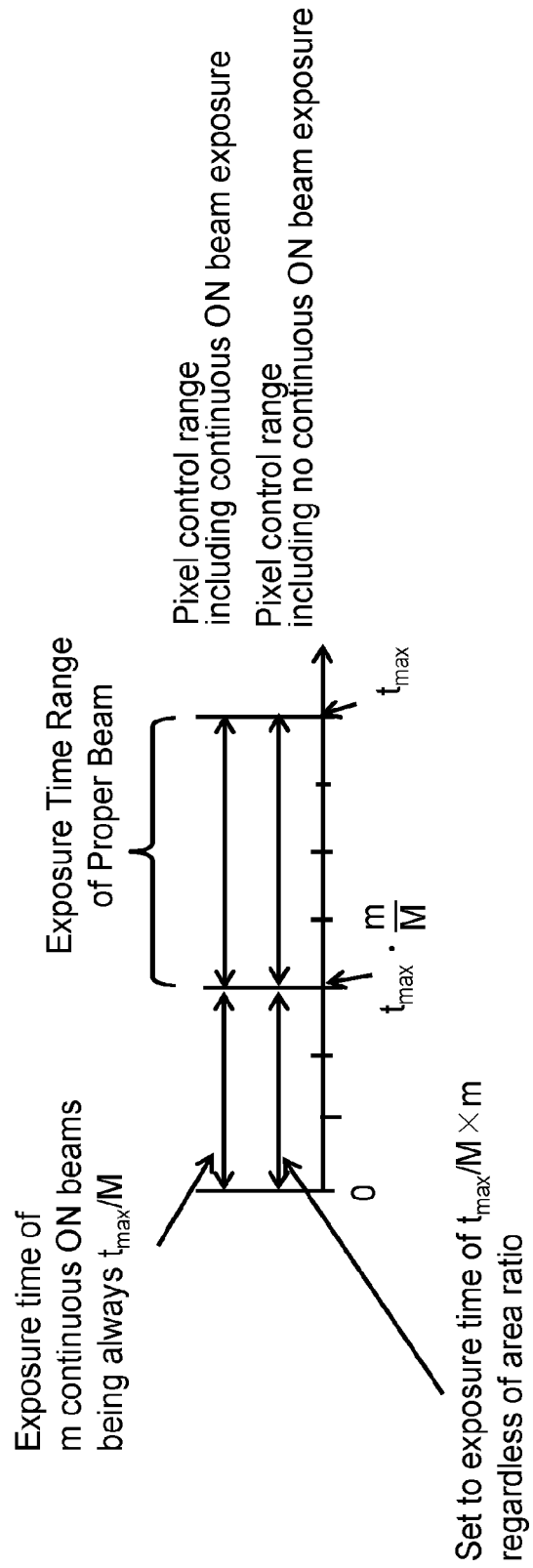
FIG. 12 shows another example of the exposure time of multiple exposure according to the first embodiment.

FIG. 12 shows another example of the exposure time of multiple exposure according to the first embodiment. In the case of FIG. 12, in M time exposures, for example, m time exposures are performed with continuous ON beams (defective beams), and the remaining M-m time exposures are performed with proper beams. Depending upon performance of the blanking aperture array mechanism 204, the number m of continuous ON beams (defective beams) to exposes one pixel 36 may be two or more. In such a case, in M time exposures, the irradiation time $t_i(x)$ of m time exposures is set to be the irradiation time t' equivalent to the offset dose, and each irradiation time $t_i(x)$ of the remaining M-m exposures is set to be an allotted value of the irradiation time $t_r(x)$ equivalent to the incident dose D(x). With respect to the pixel 36 exposed with a continuous ON beam (defective beam), it is needless to say that the irradiation time $t_i(x)$ of m passes using continuous ON beams (defective beams) is set to be the time t'. With respect to the pixel 36 exposed using no continuous ON beam (defective beam), the irradiation time $t_i(x)$ of any m passes of M passes is set to be the time t'. There may be a pixel(s) 36 in a case where "a" passes being fewer than "m" passes use continuous ON beams (defective beams). In such a case, the irradiation time $t_i(x)$ of the "a" passes using continuous ON beams (defective beams) and the irradiation time $t_i(x)$ of any (m-a) passes of M passes are set to be the time t'.

According to the first embodiment, one pass shot of the maximum irradiation time Ttr is divided into n divided shots which continuously irradiate the same position and each of which has a different irradiation time. The n divided shots are continuously superposed to the same position. First, a gray-scale value Ntr is defined by dividing the maximum irradiation time Ttr by a quantization unit Δ (gray-scale value resolution). For example, when n=10, it is divided into ten divided shots. When defining the gray-scale value Ntr by n-digit binary value, the quantization unit Δ should be set in advance such that the gray-scale value Ntr is Ntr=1023. Here, as described above, the maximum writing time Ttr (the maximum irradiation time) per pass is set to be the irradiation time t' equivalent to an offset dose, and the quantization unit Δ is set such that the gray-scale value Ntr of the time t' is 1023. By this, the maximum irradiation time Ttr (irradiation time t' equivalent to offset dose) per pass is Ttr=1023Δ. Each of n divided shots has one of the irradiation time of 512Δ(=$2^9$Δ), 256Δ(=$2^8$Δ), 128Δ(=$2^7$Δ), 64Δ(=$2^6$Δ), 32Δ(=$2^5$Δ), 16Δ(=$2^4$Δ), 8Δ(=$2^3$Δ), 4Δ(=$2^2$Δ), 2Δ(=$2^1$Δ), and Δ(=$2^0$Δ). That is, one shot of multi-beams is divided into a divided shot having the irradiation time tk of 512Δ, a divided shot having the irradiation time tk of 256Δ, a divided shot having the irradiation time tk of 128Δ, a divided shot having the irradiation time tk of 64Δ, a divided shot having the irradiation time tk of 32Δ, a divided shot having the irradiation time tk of 16Δ, a divided shot having the irradiation time tk of 8Δ, a divided shot having the irradiation time tk of 4Δ, a divided shot having the irradiation time tk of 2Δ, and a divided shot having the irradiation time tk of Δ.

Therefore, an arbitrary irradiation time $t_i(x)$ (=NΔ) of a beam of each pass to irradiate each pixel 36 can be defined by at least one combination of 512Δ(=$2^9$Δ), 256Δ(=$2^8$Δ), 128Δ(=$2^7$Δ), 64Δ(=$2^6$Δ), 32Δ(=$2^5$Δ), 16Δ(=$2^4$Δ), 8Δ(=$2^3$Δ), 4Δ(=$2^2$Δ), 2Δ(=$2^1$Δ), Δ(=$2^0$Δ), and zero (0). For example, when there is a shot whose N is N=50, since 50=$2^5$+$2^4$+$2^1$, it means a combination of a divided shot having the irradiation time of $2^5$Δ, and a divided shot having the irradiation time of $2^4$Δ, and a divided shot having the irradiation time of $2^1$Δ. When converting the gray-scale value N of an arbitrary irradiation time t for irradiating each pixel 36 into a binary number, it is preferable to define to use a value of a possible larger number of digits. Therefore, the following steps are performed.

In the gray-scale value N calculation step (S112), the gray-scale value N calculation unit 86 calculates gray-scale value N data being integers by dividing the irradiation time $t_i(x)$ of the pass concerned acquired for each pixel 36 by a quantization unit Δ (gray scale value resolution). The gray-scale value N data is defined by gray scale values from 0 to 1023, for example.

In the divided shot ON/OFF determination step (S114), the determination unit 88 determines, for each pixel 36, whether to make each divided shot of a plurality of divided shots beam ON or beam OFF so that the total irradiation time of divided shots to be beam ON of the pass concerned may be a combination equivalent to a determined beam irradiation time $t_i(x)$ of the pass concerned. The irradiation time $t_i(x)$ acquired for each pixel 36 is defined by the following equation (5) using an integer $w_k(x)$ indicating either value 0 or 1, and an irradiation time $T_k$ of the k-th divided shot in n divided shots. The divided shot whose integer $w_k(x)$ is 1 is set to be ON, and the divided shot whose integer $w_k(x)$ is 0 (zero) is set to be OFF. With respect to a shot of a pass whose irradiation time $t_i(x)$ is the time t', all of the plurality of divided shots are set to be beam ON.

$$t_i(x) = \sum_{k=1}^{n} w_k(x) T_k \qquad (5)$$

Figure 13:
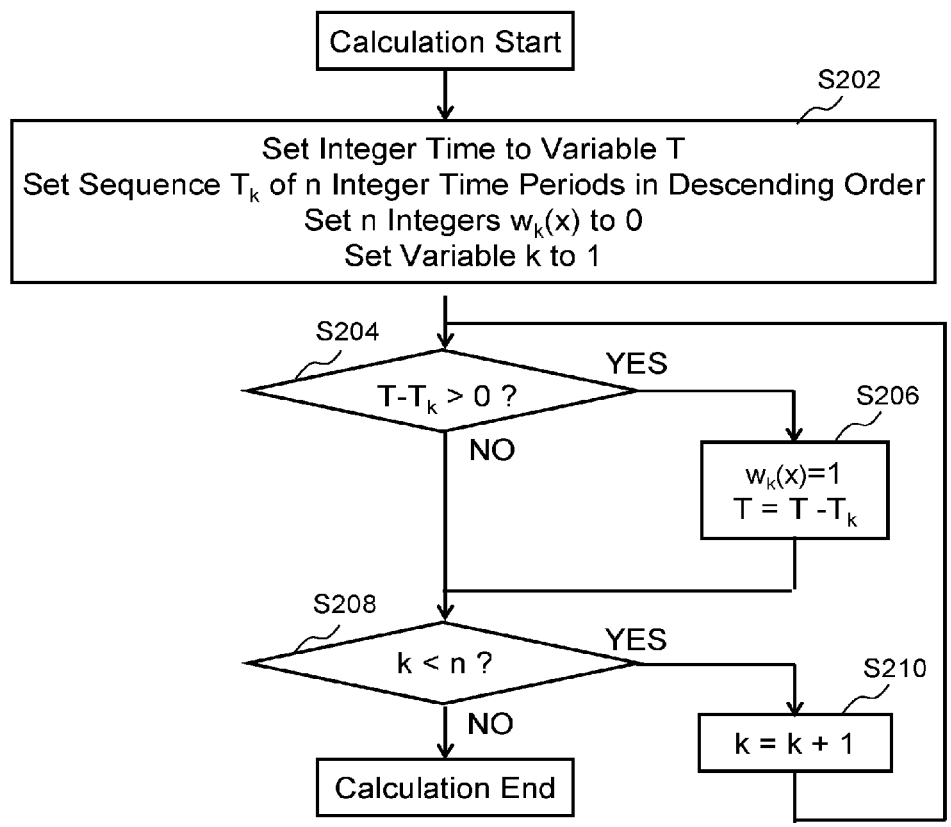
FIG. 13 is a flowchart showing the step of a method for determining ON or OFF of a divided shot according to the first embodiment.

FIG. 13 is a flowchart showing the step of a method for determining ON or OFF of a divided shot according to the first embodiment. The determination circuit 88 performs each step of the flowchart shown in FIG. 13.

First, in an initial setting step (S202), a variable T=NΔ is set. When converting the gray-scale value N of an arbitrary irradiation time $t_i(x)$ for irradiating each pixel 36 into a binary number, it is preferable to define to use a value of a possible larger number of digits. Therefore, the sequence $T_k$ of n integer time periods is set in descending order. Here, n=10 and the sequence $T_k$={512 Δ(=T1), 256Δ(=T2), 128Δ(=T3), 64Δ(=T4), 32Δ(=T5), 16Δ(=T6), 8Δ(=T7), 4Δ(=T8), 2Δ(=T9), Δ(=T10)} are set. n integers $w_k(x)$ are all set to "0", and the variable k is set to "1".

In a determination step (S204), it is determined whether a variable T−$T_k$>0. If T−$T_k$>0, it proceeds to a setting step (S206). If not T−$T_k$>0, it proceeds to a determination step (S208).

In the setting step (S206), $w_k(x)$=1 is set. Moreover, T=T−$T_k$ is calculated. After the calculation, it proceeds to the determination step (S208).

In the determination step (S208), it is determined whether the variable k<n. If k<n, it proceeds to an addition step (S210). If not k<n, it ends.

In the addition step (S210), 1 is added to the variable k (k=k+1). Then, it returns to the determination step (S204). Then, steps form the determination step (S204) to the addition step (S210) are repeated until it becomes "not k<n" in the determination step (S208).

For example, when N=700, T1=512Δ. Then, 700Δ−512Δ=188Δ. Thus, T−T1>0. Therefore, w1(x)=1 is set in the setting step (S206). Moreover, it becomes T=700Δ−512Δ=188Δ. If k=1, 1<10. Therefore, after calculating k=k+1, it returns to the determination step (S204). By similarly repeating, it becomes w1(x)=1, w2(x)=0, w3(x)=1, w4(x)=0, w5(x)=1, w6(x)=1, w7(x)=1, w8(x)=1, w9(x)=0, and w10(x)=0. Therefore, it can be determined that the divided shot of T1 is ON, the divided shot of T2 is OFF, the divided shot of T3 is ON, the divided shot of T4 is OFF, the divided shot of T5 is ON, the divided shot of T6 is ON, the divided shot of T7 is ON, the divided shot of T8 is ON, the divided shot of T9 is OFF, and the divided shot of T10 is OFF.

In the irradiation time array data generation step (S116), the data generation unit 90 generates irradiation time array data of a divided shot for dividing one shot into a plurality of divided shots which continuously irradiate the same position and each of which has a different irradiation time. The data generation unit 90 generates, for each pixel 36, irradiation time array data of a divided shot to be applied to the pixel concerned. For example, when N=50, 50=$2^5$+$2^4$+$2^1$. Therefore, it becomes "0000110010". For example, when N=500, it becomes "0111110100". When N=700, it becomes "1010111100". When N=1023, it becomes "1111111111".

In the irradiation time array data processing step (S118), the array processing unit 70 processes irradiation time array data in the order of shots of beams. As explained with reference to FIG. 6, the pixel 36 adjacent in the direction of stage movement is not necessarily shot followingly. Therefore, the array processing unit 70 processes the order of the data such that the irradiation time array data of each pixel 36 is arranged in the order of pixels 36 shot by the multi-beams 20 sequentially in accordance with the writing sequence.

FIG. 14 shows an example of a part of irradiation time array data according to the first embodiment. FIG. 14 shows apart of irradiation time array data of a predetermined shot with respect to beams, such as beams 1 to 5, in the multi-beams. The example of FIG. 14 shows irradiation time array data of from the k-th divided shot to the (k-3)th divided shot concerning the beams 1 to 5. For example, as to the beam 1, data "1101" is shown for the divided shots from the k-th divided shot to the (k-3)th divided shot. As to the beam 2, data "1100" is shown for the divided shots from the k-th divided shot to the (k-3)th divided shot. As to the beam 3, data "0110" is shown for the divided shots from the k-th divided shot to the (k-3)th divided shot. As to the beam 4, data "0111" is shown for the divided shots from the k-th divided shot to the (k-3)th divided shot. As to the beam 5, data "1011" is shown for the divided shots from the k-th divided shot to the (k-3) th divided shot. The processed irradiation time array data is stored in the storage device 142.

In the k-th data transmission step (S122), the transmission processing unit 82 outputs, for each shot of each beam (a plurality of divided shots for each shot concerned), irradiation time array data to the deflection control circuit 130. The deflection control circuit 130 outputs, for each divided shot, the irradiation time array data to the logic circuit 41 for each beam. Moreover, synchronized with this, the deflection control circuit 130 outputs timing data of each divided shot to the logic circuit 131 for common blanking.

As explained with reference to FIG. 7, since the shift register 40 is used for the logic circuit 41, the deflection control circuit 130 transmits data of divided shots each having the same order in each shot to each logic circuit 41 of the blanking aperture array mechanism 204, where the transmission is performed in the order of beam array (or in the order of identification number). For example, the blankers arranged in a matrix in the blanking aperture array mechanism 204 are grouped by the row or column, and data is transmitted per group. Moreover, a clock signal (CLK1) for synchronization, a read signal (read) for data read-out, and an AND computing circuit signal (BLK signal) are output. In the case of FIG. 14, for example, as the k-th data of the beams 1 to 5, each one bit data of "10011" is transmitted from the posterior beam side. The shift register 40 of each beam transmits data to the next shift register 40 in order from the high-order side, based on a clock signal (CLK1). For example, with respect to the k-th data of the beams 1 to 5, based on clock signals of five times, one bit data "1" is stored in the shift register 40 of the beam 1. One bit data "1" is stored in the shift register 40 of the beam 2. One bit data "0" is stored in the shift register 40 of the beam 3. One bit data "0" is stored in the shift register 40 of the beam 4. One bit data "1" is stored in the shift register 40 of the beam 5.

Next, in response to an input of a read signal (read), the register 42 of each beam reads the k-th data of each beam from the shift register 40. In the example of FIG. 14, one bit data "1" is stored, as the k-th data, in the register 42 of the beam 1. One bit data "1" is stored, as the k-th data, in the register 42 of the beam 2. One bit data "0" is stored, as the k-th data, in the register 42 of the beam 3. One bit data "0" is stored, as the k-th data, in the register 42 of the beam 4. One bit data "1" is stored, as the k-th data, in the register 42 of the beam 5. When inputting the k-th data, the individual register 42 of each beam outputs an ON/OFF signal to the AND computing unit 44, based on the input k-th data. If the k-th data is "1", an ON signal is output, and if it is "0", an OFF signal is output. Then, when the BLK signal is an ON signal and the signal of the register 42 is ON, the AND computing unit 44 outputs an ON signal to the amplifier 46, and then, the amplifier 46 applies an ON voltage to the electrode 24 of the individual blanking deflector. In the case other than the above, the AND computing unit 44 outputs an OFF signal to the amplifier 46, and then, the amplifier 46 applies an OFF voltage to the electrode 24 of the individual blanking deflector.

While the k-th data is being processed, the deflection control circuit 130 transmits the (k-1) th data to each logic circuit 41 of the blanking aperture array mechanism 204 in the order of beam array (or in the order of identification number). In the case of FIG. 12, for example, as the (k-1)th data of the beams 1 to 5, each one bit data of "01111" is transmitted from the posterior beam side. The shift register 40 of each beam transmits data to the next shift register 40 in order from the high-order side, based on a clock signal (CLK1). For example, with respect to the (k-1)th data of the beams 1 to 5, based on clock signals of five times, one bit data "1" is stored in the shift register 40 of the beam 1. One bit data "1" is stored in the shift register 40 of the beam 2. One bit data "1" is stored in the shift register 40 of the beam 3. One bit data "1" is stored in the shift register 40 of the beam 4. One bit data "0" is stored in the shift register 40 of the beam 5. After the k-th irradiation time has been completed, the deflection control circuit 130 outputs the (k-1)th read signal. Based on the (k-1)th read signal, the register 42 of each beam reads the (k-1)th data of each beam, from the shift register 40. Similarly, it should proceed to the first data processing.

The AND computing unit 44 shown in FIG. 7 may be omitted. However, it is effective in that a beam can be controlled to be OFF by the AND computing unit 44 when not being able to obtain a beam off state because of trouble of an element of the logic circuit 41. Although the case of FIG. 7 uses a data transmission channel for one bit where the shift registers are arranged in series, it is also preferable to use a plurality of parallel transmission channels in order to perform controlling by data of two or more bits, which further increases the speed of transmission.

In the k-th divided shot step (S128), under the control of the writing control unit 84, the writing mechanism 150 irradiates the target object 101 with the k-th divided shot using the electron multi-beams 20 while being synchronized with the movement of the XY stage 105. Here, the divided shot is performed with the beam corresponding to the k-th divided shot.

In the determination step (S130), the determination unit 96 determines whether all of a plurality of divided shots corresponding to one shot have been completed. If all the divided shots corresponding to one shot have been completed, it proceeds to the following shot. If not yet completed, it proceeds to the addition step (S132).

In the addition step (S132), the addition unit 98 adds 1 to k to be a new k. Then, it returns to the k-th data transmission step (S122). The steps from the k-th data transmission step (S122) to the addition step (S132) are repeated until it is determined in the determination step (S130) that all of a plurality of divided shots corresponding to one pass shot have been completed.

Thus, the writing mechanism 150 performs, with respect to the pixel concerned, a plurality of corresponding divided shots to be beam ON in a plurality of divided shots continuously irradiating the same pixel. Then, shifting the pixel 36 to be irradiated as described with reference to FIG. 6, a plurality of divided shots corresponding to a shot of the pass concerned are similarly performed. After writing using the pass concerned for the pixel 36 of the stripe region 32 concerned has been completed, the writing operation is similarly performed to the Mth pass, thereby completing the multiple exposure with the multiplicity M. In that case, each pixel is exposed with a different beam for each pass.

Figure 15:
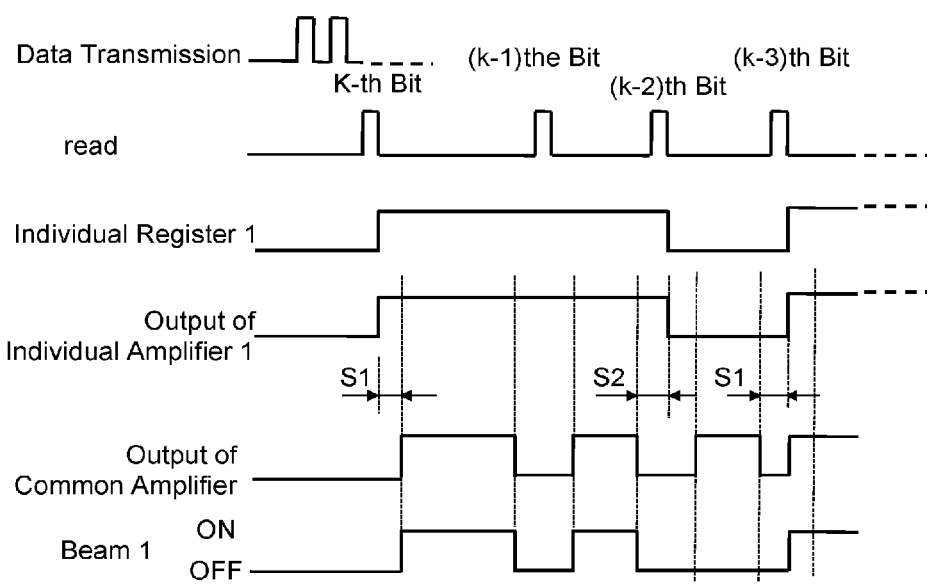
FIG. 15 is a timing chart showing a beam ON/OFF switching operation with respect to a part of a plurality of divided shots during one shot according to the first embodiment.

FIG. 15 is a timing chart showing a beam ON/OFF switching operation with respect to apart of a plurality of divided shots during one shot according to the first embodiment. FIG. 15 shows one beam (beam 1) in a plurality of beams configuring multi-beams, for example. Here are shown, for example, from the k-th to the (k-3) th divided shots of the beam 1. In the irradiation time array data, for example, the k-th is "1", the (k-1)th is "1", the (k-2)th is "0", and the (k-3)th is "1".

First, responsive to input of the k-th read signal, the individual register 42 outputs an ON/OFF signal, based on a stored data (1 bit) of the k-th bit.

Since the k-th data indicates ON, the individual amplifier 46 (individual amplifier 1) outputs an ON voltage to be applied to the blanking electrode 24 for the beam 1. On the other hand, the logic circuit 131 for common blanking switches ON or OFF depending upon timing data of each divided shot used in the shot concerned. The common blanking mechanism outputs an ON signal during the irradiation time of each divided shot. When a plurality of divided shots of the shot concerned are configured by four divided shots whose respective irradiation time periods are 512Δ, 256Δ, 64Δ, and 32Δ, for example, if Δ=1 ns, the irradiation time of the first divided shot is 512Δ=512 ns. The irradiation time of the second divided shot is 256Δ=256 ns. The irradiation time of the third divided shot is 64Δ=64 ns. The irradiation time of the fourth divided shot is 32Δ=32 ns. In the logic circuit 131, when timing data of each divided shot is input into the register 50, controlling is performed such that the register 50 outputs the ON data of the k-th, the counter 52 counts the irradiation time of the k-th divided shot, and it becomes OFF after the irradiation time has passed.

Compared with ON/OFF switching of the individual blanking mechanism, the common blanking mechanism performs ON/OFF switching after the voltage stabilization time (settling time) S1/S2 of the amplifier 46 has passed. In the example of FIG. 15, after the individual amplifier 1 has become ON and the settling time S1 of the individual amplifier 1 at switching from OFF to ON has passed, the common amplifier becomes ON. Thereby, beam irradiation at an unstable voltage at the time of rise of the individual amplifier 1 can be avoided. Then, the common amplifier becomes OFF after the irradiation time of the k-th divided shot concerned has passed. Consequently, in the case of both the individual amplifier and the common amplifier being ON, an actual beam becomes ON to irradiate the target object 101. Therefore, it is controlled such that the ON time period of the common amplifier is the irradiation time of the actual beam. On the other hand, in the case of the individual amplifier 1 becoming OFF, after the common amplifier becomes OFF and the settling time S2 has passed, the individual amplifier 1 becomes OFF. Thereby, beam irradiation at an unstable voltage at the fall time of the individual amplifier 1 can be avoided.

As described above, in addition to controlling ON/OFF switching of each beam by the individual blanking mechanism 47, by using the common blanking mechanism 213, beam ON/OFF controlling is collectively performed for the entire multi-beams, and blanking control is performed so that the beam may be in the ON state only during the irradiation time corresponding to each k-th divided shot. Thereby, each shot of the multi-beams is divided into a plurality of divided shots, each having a different irradiation time, to continuously irradiate the same position.

Therefore, even if a continuous ON beam (defective beam) exists, it is possible to collectively make the entire multi-beams, namely the continuous ON beam and proper beams, OFF by the common blanking mechanism 213. According to the first embodiment, since the common blanking mechanism 213 controls the irradiation time of each divided shot, even if all the divided shots are continuous ON beams (defective beams), it is possible to accurately control the total irradiation time (total exposure time) of all the divided shots for one pass. Then, the total irradiation time of all the divided shots for one pass is made to be the time t' equivalent to an offset dose, and each pixel 36 is irradiated with the exposure of one of passes during the time t'. With respect to a pixel irradiated with a continuous ON beam (defective beam), exposure is performed during the time t' by the pass of irradiation with the continuous ON beam. With respect to a pixel irradiated with no continuous ON beam (defective beam), exposure is performed during the time t' by one of passes. Thereby, the dose being the same as that of a continuous ON beam (defective beam) can be uniformly incident onto all the pixels 36. According to the first embodiment, as shown in the equation (2), since the dose equation of a threshold model using a term of the offset dose is set, other specific incident dose D(x) can be calculated. Therefore, the total dose of each pixel 36 can be controlled by the specific incident dose D(x) using a proper beam which is added to the offset dose uniformly incident onto all the pixels 36.

As described above, using multi-beams including a defective beam being always ON, the writing mechanism 150 performs multiple writing such that a beam of the total dose between a calculated incident dose D(x) for a corresponding pixel 36 and the offset dose $D_{off}$ irradiates the corresponding pixel 36 for each pixel 36 while switching a beam to irradiate each corresponding pixel 36 for each pass of multiple writing and controlling the irradiation time t' equivalent to the offset dose by the common blanking mechanism 213 which collectively blanking-controls the multi-beams.

Figure 16:
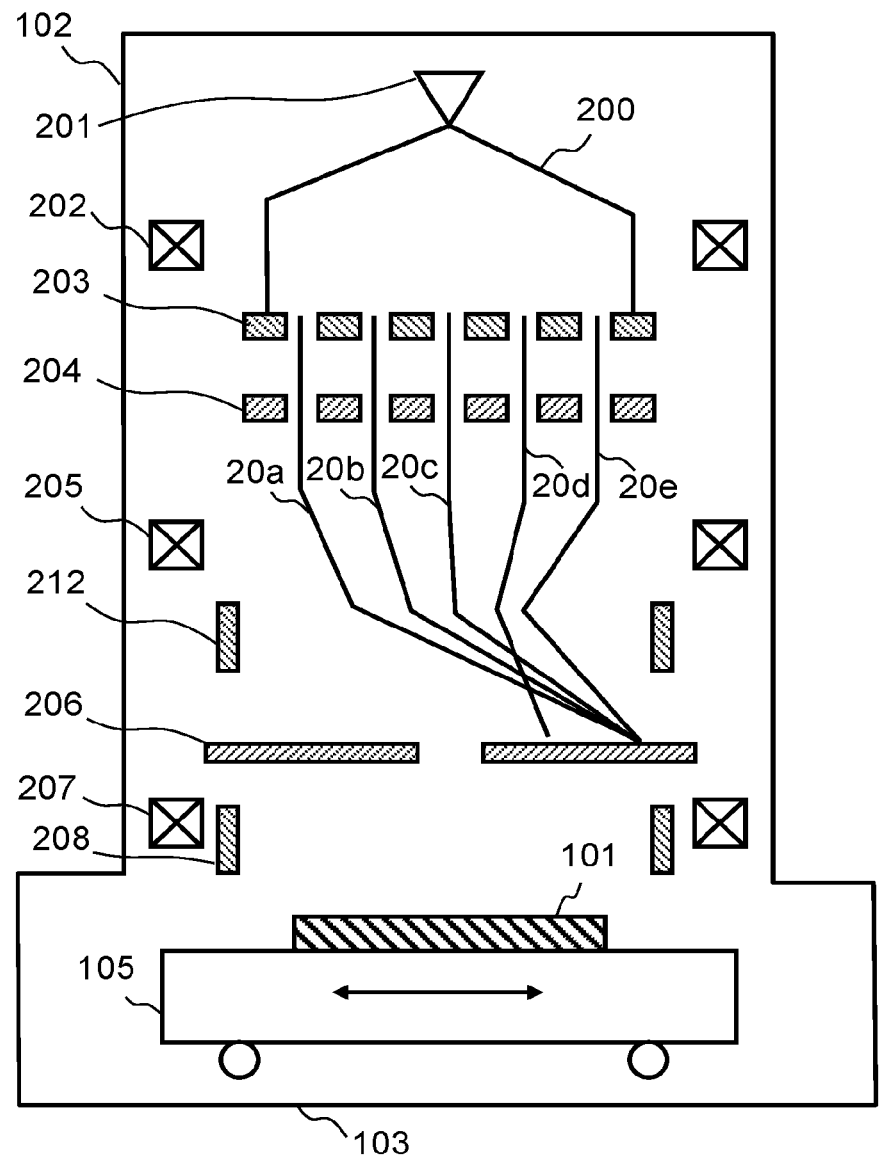
FIG. 16 is a conceptual diagram illustrating a blanking operation according to the first embodiment.

FIG. 16 is a conceptual diagram illustrating a blanking operation according to the first embodiment. The electron beam 200 emitted from the electron gun 201 (emitter) almost perpendicularly (e.g., vertically) illuminates the whole of the forming aperture array substrate 203 by the illumination lens 202. A plurality of holes (openings) each being a quadrangle are formed in the forming aperture array substrate 203. The region including all the plurality of holes 22 is irradiated by the electron beam 200. For example, a plurality of quadrangular electron beams (multi-beams) 20a to 20e are formed by letting portions of the electron beam 200, which irradiates the positions of a plurality of holes 22, individually pass through a corresponding hole of the plurality of holes 22 of the forming aperture array substrate 203. The multi-beams 20a to 20e individually pass through corresponding blankers (first deflector: individual blanking mechanism) of the blanking aperture array mechanism 204. Each blanker maintains the state of the beam ON or OFF of at least the electron beam 20 individually passing, based on the individual register 42, during the period of the writing time (irradiation time)+α which is set for a divided shot. As described above, the irradiation time of each divided shot is controlled by the deflector 212 (common blanking mechanism 213).

The multi-beams 20a to 20e having passed through the blanking aperture array mechanism 204 are reduced by the reducing lens 205, and go toward the hole in the center of the limiting aperture substrate 206. At this stage, the electron beam 20 which was deflected by the blanker of the blanking aperture array mechanism 204 deviates from the hole in the center of the limiting aperture substrate 206 (blanking aperture member) and is blocked by the limiting aperture substrate 206. On the other hand, the electron beam 20 which was not deflected by the blanker of the blanking aperture array mechanism 204 passes through the hole in the center of the limiting aperture substrate 206, if it is not deflected by the deflector 212 (common blanking mechanism 213), as shown in FIG. 1. Blanking control is performed by combination of ON/OFF of the individual blanking mechanism 47 and ON/OFF of the common blanking mechanism 213 so as to control ON/OFF of the beam. Thus, the limiting aperture substrate 206 blocks each beam which was deflected to be the OFF state by the individual blanking mechanism 47 or the common blanking mechanism 213. Then, each beam of a plurality of divided shots obtained by dividing a one pass shot is formed by a beam made during a period from becoming ON to becoming OFF and having passed through the limiting aperture substrate 206. The multi-beams 20 having passed through the limiting aperture substrate 206 are focused by the objective lens 207 so as to be a pattern image of a desired reduction ratio. Respective beams (the whole of the multi-beams 20) having passed through the limiting aperture substrate 206 are collectively deflected in the same direction by the deflectors 208 and 209 in order to irradiate respective beam irradiation positions on the target object 101. While the XY stage 105 is continuously moving, controlling is performed by the deflector 208 so that the irradiation positions of the beams may follow (track) the movement of the XY stage 105, for example. The multi-beams 20 irradiating at a time are ideally aligned at pitches obtained by multiplying the arrangement pitch of a plurality of holes of the forming aperture array substrate 203 by a desired reduction ratio described above.

As described above, according to the first embodiment, even when a continuous ON beam (defective beam) is generated in multi-beams, irradiation time control is highly accurately performed such as making the total of the exposure time for each pixel be a desired value irrespective of whether exposure of the continuous ON beam is included or not. Therefore, the precision of the size and the position of a pattern can be enhanced.

According to the first embodiment, exposure of an offset dose is performed even for a pixel with no pattern which is not originally exposed when there is no continuous ON beam. Therefore, when the method of the first embodiment is used in the case of there being a continuous ON beam, an exposure amount difference (contrast) between the position with no pattern and the position with a pattern may fall, and especially the resolution of a minute pattern may fall. The rate of the contrast degradation is around m/M. If increasing the number M of passes, it becomes possible to decrease the offset dose and inhibit the fall of the exposure amount contrast, but the data transmission amount and transmission time to a blanking aperture array increase. If the transmission time exceeds the exposure time, the writing time will be extended. Then, the second embodiment below describes a method of decreasing an offset dose to further inhibit the contrast degradation other than the method of increasing the number M of passes.

Second Embodiment

Although the first embodiment describes the case where a beam to irradiate each pixel 36 is switched per pass of multiple exposure, in other words, the same beam is used in the same pass for exposure, it is not limited thereto. The second embodiment describes the case where a beam is switched, in the same pass, per pixel 36.

Figure 17:
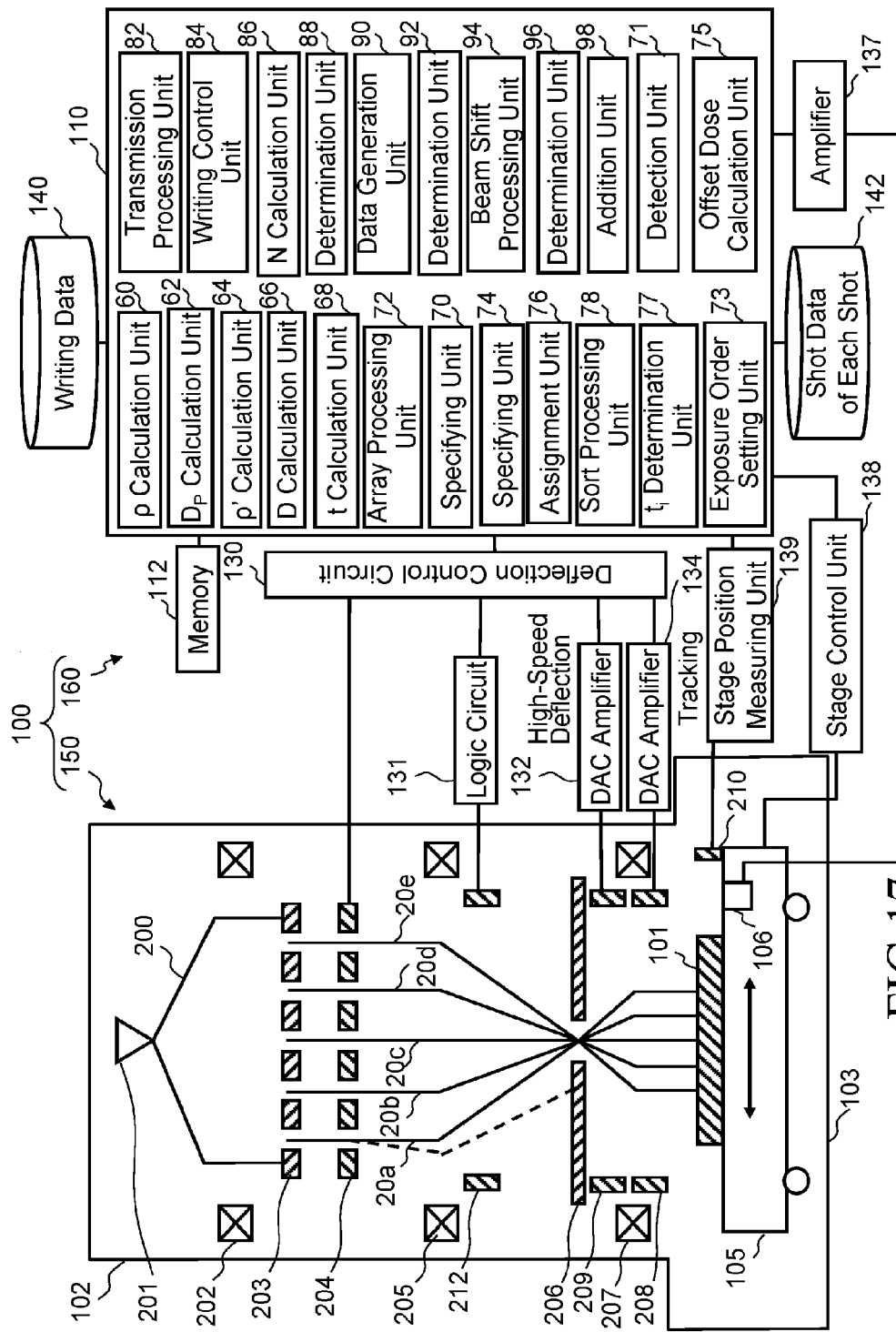
FIG. 17 is a conceptual diagram showing a structure of a writing apparatus according to a second embodiment.

FIG. 17 is a conceptual diagram showing a structure of a writing apparatus according to the second embodiment. FIG. 17 is the same as FIG. 1 except that a specifying unit 72, a specifying unit 74, an assignment unit 76, a sort processing unit 78, a determination unit 92, and a beam shift processing unit 94 are further arranged in the control computer 110.

The incident dose calculation unit 61 is configured by the pattern area density ρ calculation unit 60, the proximity effect correction irradiation coefficient $D_p$ calculation unit 62, the pattern area density ρ' in pixel calculation unit 64, and the dose D calculation unit 66. Each of ". . . units" such as the pattern area density ρ calculation unit 60, the proximity effect correction irradiation coefficient $D_p$ calculation unit 62, the pattern area density ρ' in pixel calculation unit 64, the dose D calculation unit 66, the irradiation time t calculation unit 68, the array processing unit 70, the detection unit 71, the exposure order setting unit 73, the offset dose calculation unit 75, the irradiation time $t_i$ determination unit 77, the gray-scale value N calculation unit 86, the determination unit 88, the data generation unit 90, the determination unit 96, the addition unit 98, the transmission processing unit 82, the writing control unit 84, the specifying unit 72, the specifying unit 74, the assignment unit 76, the sort processing unit 78, the determination unit 92, and the beam shift processing unit 94 includes a processing circuitry. As the processing circuitry, for example, an electric circuit, computer, processor, circuit board, quantum circuit, semiconductor device, or the like can be used. Each ". . . unit" may use a common processing circuitry (same processing circuitry), or different processing circuitries (separate processing circuitries). Data which is input and output to/from the pattern area density ρ calculation unit 60, the proximity effect correction irradiation coefficient $D_p$ calculation unit 62, the pattern area density ρ' in pixel calculation unit 64, the dose D calculation unit 66, the irradiation time t calculation unit 68, the array processing unit 70, the detection unit 71, the exposure order setting unit 73, the offset dose calculation unit 75, the irradiation time $t_i$ determination unit 77, the gray-scale value N calculation unit 86, the determination unit 88, the data generation unit 90, the determination unit 96, the addition unit 98, the transmission processing unit 82, the writing control unit 84, the specifying unit 72, the specifying unit 74, the assignment unit 76, the sort processing unit 78, the determination unit 92, and the beam shift processing unit 94, and data being operated are stored in the memory 112 each time.

Figure 18:
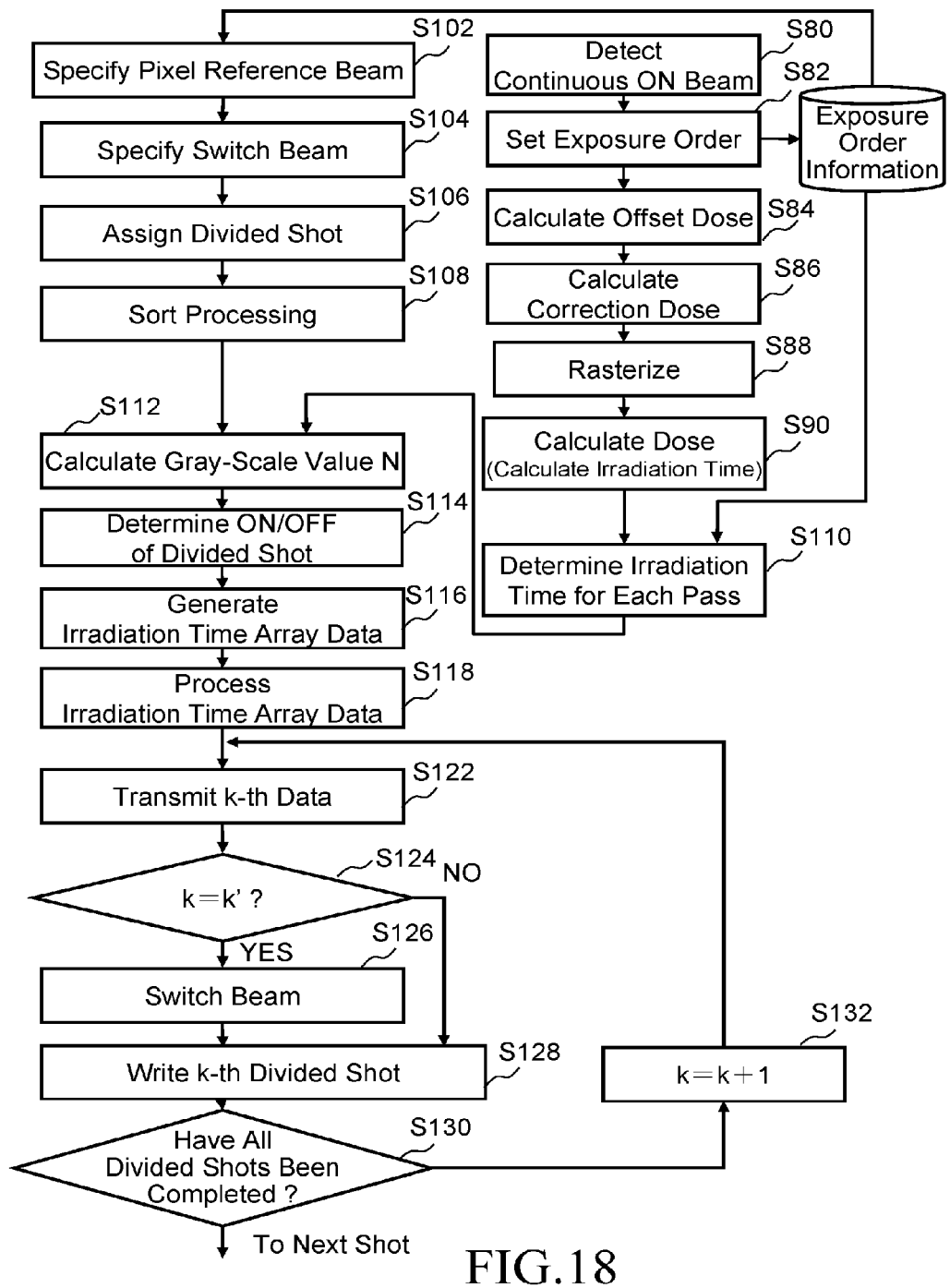
FIG. 18 is a flowchart showing main steps of a writing method according to the second embodiment.

FIG. 18 is a flowchart showing main steps of a writing method according to the second embodiment. The writing method of FIG. 18 of the second embodiment is the same as that of FIG. 8 except that a reference beam specifying step (S102) for each pixel, a switch beam specifying step (S104), a divided shot assigning step (S106), and a sort processing step (S108) are added between the exposure order setting step (S82) and the irradiation time determination step (S110) for each pass of multiple exposure, and that a determination step (S124) and a beam switching step (S126) are added between the k-th data transmission step (S122) and the k-th divided shot step (S128). A series of the steps of the reference beam specifying step (S102) for each pixel, the switch beam specifying step (S104), the divided shot assigning step (S106), and the sort processing step (S108) is performed in parallel or in series with a series of the steps of the offset dose calculation step (S84), the correction dose calculation step (S86) for each pixel, the rasterization step (S88), and the dose calculation step (irradiation time calculation step) (S90) for each pixel. However, as will be described later, it is necessary to perform the offset dose calculation step (S84), which calculates a does offset, using an assignment rule used in the divided shot assigning step (S106).

The contents of the present embodiment are the same as those of the first embodiment except what is specifically described below.

The contents of the continuous ON beam detection step (S80) and the exposure order setting step (S82) are the same as those of the first embodiment.

In the reference beam specifying step (S102) for each pixel, the specifying unit 72 specifies, for each pixel 36, a reference beam to irradiate the pixel concerned. In multi-beam writing, as described with reference to FIGS. 4 to 6, writing of the stripe region 32 proceeds by repeating the tracking cycle while shifting a pixel to be written. It depends on the writing sequence which beam of the multi-beams irradiates which pixel 36. For each pixel 36, the specifying unit 70 reads out exposure order information, and specifies, for each pass and each pixel 36, abeam of the pixel 36 concerned of each pass which has been defined depending on the writing sequence, as a reference beam. In the example of FIG. 6, the beam (1) of coordinates (1, 3) is specified as a reference beam for the first pixel from the right in the bottom row of the grid 29 concerned ("target grid" or "grid of interest") with respect to the pass shot concerned (total of a plurality of divided shots).

In the switch beam specifying step (S104), the specifying circuit 74 specifies, for each pixel 36, a beam that can be switched by collective deflection of multi-beams, as a switch beam to irradiate the pixel concerned.

Figures 19A, 19B:
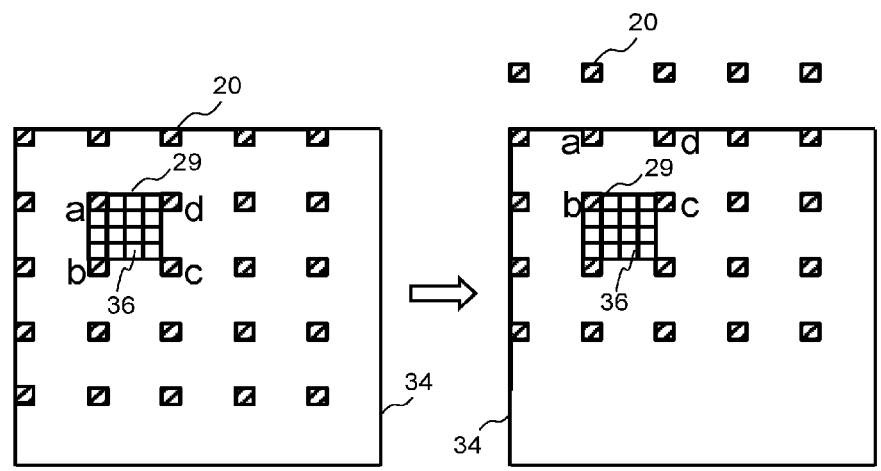
FIGS. 19A and 19B illustrate beam switching performed in the middle of applying a plurality of divided shots according to the second embodiment.

FIGS. 19A and 19B illustrate beam switching performed in the middle of applying a plurality of divided shots according to the second embodiment. FIG. 19A shows the case of performing a shot to the target object by using multi-beams 20 of 5×5 (rows by columns). Specifically, for example, FIG. 19A shows the case where a beam "a" of the multi-beams 20, as a reference beam, takes charge of the first pixel 36 from the left in the top row of the grid 29 concerned ("grid 29 of interest" or "target grid 29"). The beam "a" is the second beam from the left in the second row from the top of the multi-beams 20 of 5×5 irradiating the irradiation region 34 which can be irradiated at a time (one shot of the multi-beams 20). After, for example, the first to eighth divided shots in a plurality of divided shots have been performed with the beam "a", the beam irradiation position of the multi-beams 20 of 5×5 is shifted upward in FIG. 19A by one beam pitch by collective deflection of the deflector 209. Thereby, as shown in FIG. 19B, the beam which takes charge of the first pixel 36 from the left in the top row of the grid 29 concerned is switched to the beam "b" from the beam "a". Then, the beam "b" takes charge of the remaining divided shots in a plurality of divided shots. By this, the first pixel 36 from the left in the top row of the grid 29 concerned is multiply exposed by the two beams "a" and "b". Therefore, even when the diameter of the hole 22 (aperture) of the forming aperture array substrate 203 for forming the beam "a" has a processing error against the design value, the error of the beam current amount can be equalized by superimposingly applying the beam "b". As a result, the error of the dose to the pixel concerned can be reduced. For example, by applying the two beams "a" and "b", statistical errors of variation in beam current irradiating the pixel 36 concerned can be reduced compared with applying the beam "a" only. For example, if it is possible to make the irradiation time periods of two beams the same, the statistical error of variation in beam current can be reduced to ½^(1/2) times compared with applying the beam "a" only. Although the case of precedently performing a divided shot of a reference beam (beam "a") is described in FIGS. 19A and 19B, it is also preferable to precedently perform a divided shot of a switch beam (beam "b") as will be described later.

Although the example of FIGS. 19A and 19B shows the case where the multi-beams 20 of 5×5 are collectively deflected upward (y direction) by one beam pitch by the deflector 209, it is not limited thereto. For example, the multi-beams 20 of 5×5 may be collectively deflected leftward (x direction) by one beam pitch by the deflector 209. Alternatively, it is also preferable to collectively deflect the multi-beams 20 of 5×5 rightward (−x direction) by one beam pitch by the deflector 209. Alternatively, it is also preferable to collectively deflect the multi-beams 20 of 5×5 downward (−y direction) by one beam pitch by the deflector 209. Moreover, the beam shift amount is not limited to the amount of one beam pitch. It may be two or more beam pitches. As long as the beam shift amount is an integral multiple of the beam pitch deflectable by the deflector 209, switching to any one of beams can be performed.

In the divided shot assigning step (S106), for each pixel 36 (unit irradiation region) of the target object 101 per beam of the multi-beams 20, the assignment unit 76 assigns each of a plurality of divided shots, which are obtained by dividing a shot of the maximum irradiation time Ttr and each of which has a different irradiation time to continuously irradiate the same pixel 36, to at least one of a plurality of beams that can be switched by collective deflection of the multi-beams 20. According to the second embodiment, each divided shot of a plurality of divided shots is assigned to one of a plurality of beams that can be switched by collective deflection of the multi-beams 20, for example.

Figures 20A, 20B:
FIGS. 20A and 20B show an example of assignment between a plurality of divided shots and beams according to the second embodiment.

FIGS. 20A and 20B show an example of assignment between a plurality of divided shots and beams according to the second embodiment. In the second embodiment, similarly to the first embodiment, one pass shot of the maximum irradiation time Ttr is divided into n divided shots which continuously irradiate the same position and each of which has a different irradiation time. As shown in FIG. 20A, similarly to the first embodiment, each of n divided shots has one of the irradiation time of 512Δ(=$2^9$Δ), 256Δ(=$2^8$Δ), 128Δ(=$2^7$Δ), 64Δ(=$2^6$Δ), 32Δ(=$2^5$Δ), 16Δ(=$2^4$Δ) 8Δ(=$2^3$Δ), 4Δ(=$2^2$Δ), 2Δ(=$2^1$Δ), and Δ(=$2^0$Δ). That is, one pass shot of multi-beams is divided into a divided shot having the irradiation time tk of 512Δ, a divided shot having the irradiation time tk of 256Δ, a divided shot having the irradiation time tk of 128Δ, a divided shot having the irradiation time tk of 64Δ, a divided shot having the irradiation time tk of 32Δ, a divided shot having the irradiation time tk of 16Δ, a divided shot having the irradiation time tk of 8Δ, a divided shot having the irradiation time tk of 4Δ, a divided shot having the irradiation time tk of 2Δ, and a divided shot having the irradiation time tk of Δ.

Therefore, as explained in the first embodiment, an arbitrary irradiation time $t_i(x)$ (=NΔ) for irradiating each pixel 36 can be defined by at least one combination of 512Δ (=$2^9$Δ), 256Δ(=$2^8$Δ), 128Δ(=$2^7$Δ), 64Δ(=$2^6$Δ), 32Δ(=$2^5$Δ), 16Δ(=$2^4$Δ), 8Δ(=$2^3$Δ), 4Δ(=$2^2$Δ), 2Δ(=$2^1$Δ), Δ(=$2^0$Δ), and zero (0).

In FIGS. 20A and 20B, the total of exposure time with a continuous ON beam is 640Δ or 383Δ with respect to a certain pixel. The greater time of them is defined to be $t_o$. In the case of FIGS. 20A and 20B, $t_o$=640Δ. Using this in the offset dose calculation step (S84), the offset dose calculation unit 75 calculates an offset dose by the following equation (6). In other words, when switching a beam to irradiate, using multi-beams including a defective beam being always ON, each of a plurality of pixels obtained by dividing the writing region of the target object by the size of a unit irradiation region for one beam of multi-beams, for each pass of multiple writing, the offset dose calculation unit 75 calculates an offset dose $D_{off}$ to irradiate all of a plurality of pixels by multiplying a dose ($t_o$·J/M) equivalent to the maximum value $t_o$ in each exposure time of a plurality of pre-set beams which are used for switching at a pass to irradiate each pixel by the maximum number m of defective beams to expose one small region.

$$D_{off}=(t_o m/M)J \qquad (6)$$

With respect to each pixel 36, for example, the assignment unit 76 assigns a divided shot having the irradiation time tk of 512Δ to a switch beam (beam "b"), a divided shot having the irradiation time tk of 256Δ to a reference beam (beam "a"), and a divided shot having the irradiation time tk of 128Δ to a switch beam (beam "b"). The assignment unit 76 assigns a divided shot having the irradiation time tk of 64Δ, a divided shot having the irradiation time tk of 32Δ, a divided shot having the irradiation time tk of 16Δ, a divided shot having the irradiation time tk of 8Δ, a divided shot having the irradiation time tk of 4Δ, a divided shot having the irradiation time tk of 2Δ, and a divided shot having the irradiation time tk of Δ to a reference beam (beam "a").

It should be set in advance which divided shot is assigned to a reference beam and which divided shot is assigned to a switch beam. Here, a plurality of divided shots should be assigned to the actual reference beam and the actual switch beam which are specified for each pixel. In each exposure of n-time divided shots, the ratio of contribution of variation in beam current to the dose for exposing the pixel 36 is proportional to the irradiation time (exposure time) of each divided shot. Therefore, from a viewpoint of reducing the variation in beam current for each beam, it is more effective to assign a divided shot having a long irradiation time (exposure time) to a plurality of beams. In the case of FIG. 20A, it has a great effect to use a plurality of beams for a divided shot having a long irradiation time (exposure time), such as around the divided shots of 512Δ, 256Δ, and 128Δ being top three, but, contrarily, it is less effective to use a plurality of beams for a divided shot around 64Δ or below. Therefore, according to the second embodiment, beam switching is performed for upper-ranking divided shots each having a long irradiation time (exposure time).

In the sort processing step (S108), the sort processing unit 78 performs processing for sorting execution orders of divided shots to be collected per beam. By sorting by beam unit, the times of beam switching operations can be reduced, and therefore, the writing time can be shortened. In the case of FIG. 20B, the divided shots of which a switch beam (beam "b") takes charge are previously collected, and then, the divided shots of which a reference beam (beam "a") takes charge follow them. Specifically, sorting is performed in the order of a divided shot having the irradiation time tk of 512Δ by the switch beam (beam "b"), a divided shot having the irradiation time tk of 128Δ by the switch beam (beam "b"), a divided shot having the irradiation time tk of 256Δ by the reference beam (beam "a"), a divided shot having the irradiation time tk of 64Δ by the reference beam (beam "a"), a divided shot having the irradiation time tk of 32Δ by the reference beam (beam "a"), a divided shot having the irradiation time tk of 16Δ by the reference beam (beam "a"), a divided shot having the irradiation time tk of 8Δ by the reference beam (beam "a"), a divided shot having the irradiation time tk of 4Δ by the reference beam (beam "a"), a divided shot having the irradiation time tk of 2Δ by the reference beam (beam "a"), and a divided shot having the irradiation time tk of Δ by the reference beam (beam "a").

In the example of FIG. 20B, with respect to a plurality of divided shots of which the same beam takes charge, a divided shot having a longer irradiation time tk is precedently performed, but it is not limited thereto. It is also preferable to precedently perform a divided shot having a shorter irradiation time tk in a plurality of divided shots of which the same beam takes charge. Alternatively, a divided shot may be performed at a random order regarding the irradiation time tk in a plurality of divided shots of which the same beam takes charge.

The contents of each step from the irradiation time determination step (S110) for each pass of multiple exposure to the k-th data transmission step (S122) are the same as those of the first embodiment. However, in the irradiation time array data processing step (S118), further, even in one shot, since the order of divided shots has been changed by the sort processing step (S108), the order of the irradiation time array data of each pixel 36 is also changed to be in accordance with the changed order of divided shots.

In the determination step (S124), the determination unit 92 determines whether the transmitted data of the k-th divided shot is the k'-th data or not, where k' is described below. In the example of FIG. 20B, since the switch beam (beam "b") executes the first and second divided shots and the reference beam (beam "a") executes the third and subsequent divided shots, it is set that k'=3. When the data of the k-th divided shot is the k'-th data, it proceeds to the beam switching step (S126). When the data of the k-th divided shot is not the k'-th data, it proceeds to the k-th divided shot step (S128).

In the case where shot is performed in order from the divided shot having a shorter irradiation time, since the reference beam (beam "a") executes the first to eighth divided shots and the switch beam (beam "b") executes the ninth and subsequent divided shots, it is set that k'=9.

In the beam switching step (S126), when the transmitted data of the k-th divided shot is the k'-th data, the beam shift processing unit 94 outputs a beam shift signal for collectively deflecting the entire multi-beams 20 to the deflection control circuit 130 so that the beam to irradiate each pixel may be switched between the reference beam and the switch beam described above. The deflection control circuit 130 outputs a deflection signal for collectively deflecting the entire multi-beams 20 to the DAC amplifier 132. Then, the DAC amplifier 132 converts the deflection signal being a digital signal into a deflection voltage being analog to be applied to the deflector 209. Thereby, as shown in FIG. 19B, for each pass, switching a beam to irradiate each pixel 36 to another beam is performed between a part of divided shots of a plurality of divided shots and other divided shots in the plurality of divided shots by collective deflection of the entire multi-beams 20 by the deflector 209. Here, the beam to irradiate each pixel is switched between the reference beam and the switch beam. In the case of FIG. 20B, since the divided shots taken charge of by the switch beam (beam "b") are precedently performed, when a divided shot is executed in accordance with the data of the third divided shot, the switch beam (beam "b") is switched to the reference beam (beam "a").

The steps after the k-th divided shot step (S128) are the same as those of the first embodiment.

As described above, according to the second embodiment, for each pass, after performing a part of divided shots of a plurality of divided shots, a beam to irradiate each pixel 36 is switched to another beam by collective deflection of multi-beams, and then, other divided shots of a plurality of divided shots are performed. Thereby, the rate of contrast degradation due to a continuous ON beam (defective beam) can be reduced to around m/2M from m/M. Specifically, it can be $(t_o/t_{max})$ (m/M) which is a ratio between the total exposure time $t_o \cdot m$ with a defective beam and the total exposure time $M \cdot t_{max}$. In the assignment shown in FIGS. 20A and 20B, since $t_o = 640\Delta$, the rate of contrast degradation due to a continuous ON beam is (640Δ/1023Δ) (m/M)=0.6 (m/M), which is smaller than the contrast degradation rate (m/M) of the first embodiment by 40 percent.

Although the case of switching a beam between two beams in one pass has been described above, it is not limited thereto. It is also preferable to perform switching between or among N beams (N being an integer of two or more). Thereby, the influence of a continuous ON beam (defective beam) can be reduced from $t_{max} \cdot m/M$ to $t_{max} \cdot m/(N \cdot M)$.

FIGS. 21A to 21D illustrate another example of beam switching performed in the middle of applying a plurality of divided shots according to the second embodiment. FIG. 21A shows the case of performing a shot to the target object by using multi-beams 20 of 5×5 (rows by columns). Specifically, for example, FIG. 21A shows the case where a beam "a" of the multi-beams 20, as a reference beam, takes charge of the first pixel 36 from the left in the top row of the grid 29 concerned ("grid 29 of interest" or "target grid 29"). The beam "a" is the second beam from the left in the second row from the top of the multi-beams 20 of 5×5 irradiating the irradiation region 34 which can be irradiated at a time (one shot of the multi-beams 20). After, for example, the first to seventh divided shots in a plurality of divided shots have been performed with the beam "a", the beam irradiation position of the multi-beams 20 of 5×5 is shifted upward in FIG. 21A by one beampitch by collective deflection of the deflector 209. Thereby, as shown in FIG. 21B, the beam which takes charge of the first pixel 36 from the left in the top row of the grid 29 concerned is switched to the beam "b" from the beam "a". Then, after the eighth and ninth divided shots in a plurality of divided shots have been performed with the beam "b", the beam irradiation position of the multi-beams 20 of 5×5 is shifted leftward in FIG. 21B by one beam pitch by collective deflection of the deflector 209. By this, as shown in FIG. 21C, the beam which takes charge of the first pixel 36 from the left in the top row of the grid 29 concerned is switched to the beam "c" from the beam "b". Then, after the tenth and eleventh divided shots in a plurality of divided shots have been performed with the beam "c", the beam irradiation position of the multi-beams 20 of 5×5 is shifted downward in FIG. 21C by one beam pitch by collective deflection of the deflector 209. By this, as shown in FIG. 21D, the beam which takes charge of the first pixel 36 from the left in the top row of the grid 29 concerned is switched to the beam "d" from the beam "c". Then, the beam "d" takes charge of the remaining divided shots. Thereby, the first pixel 36 from the left in the top row of the grid 29 concerned is multiply exposed by the four beams "a" to "d". Therefore, even when the diameter of the hole 22 (aperture) of the forming aperture array substrate 203 for forming the beam "a" has a processing error against the design value, the error of the beam current amount can be further equalized by superimposingly applying the beams "b", "c", and "d". As a result, the error of the dose to the pixel concerned can be reduced. For example, by applying the four beams "a" to "d", the influence of a continuous ON beam (defective beam) to irradiate the pixel 36 can be reduced ¼ compared with applying the beam "a" only.

Although in the examples of FIGS. 21A to 21D divided shots are applied in order of the reference beam (beam "a"), switch beam (beam "b"), switch beam (beam c), and switch beam (beam d), it is not limited thereto. For example, it is also preferable to perform divided shots in order of the switch beam (beam "d"), switch beam (beam "c"), switch beam (beam "b"), and reference beam (beam "a") as will be described later.

Figures 22A, 22B:
FIGS. 22A and 22B show another example of assignment between a plurality of divided shots and beams according to the second embodiment.

FIGS. 22A and 22B show another example of assignment between a plurality of divided shots and beams according to the second embodiment. Here, at least one of a plurality of divided shots is divided into a plurality of sub divided shots. In the case of FIG. 22A, as to a plurality of divided shots shown in FIG. 20A, the divided shot having the irradiation time of 512Δ being the top is divided into four sub divided shots, and the divided shot having the irradiation time of 256Δ being the second from the top is divided into two sub divided shots. In the case of FIG. 22A, the divided shots having the irradiation time of the top and the second from the top are divided into six sub divided shots each having the irradiation time of 128Δ which is the same as the divided shot having the irradiation time of 128Δ being the third from the top. Then, the sub divided shots are individually assigned to one of the four beams a, b, c, and d. Other divided shots are the same as those in FIG. 20A.

When using the case of FIG. 22A, in the switch beam specifying step (S104), the specifying unit 74 specifies, for each pixel 36, three switch beams (beams "b", "c", and "d") for a reference beam (beam "a").

In the divided shot assigning step (S106), with respect to each pixel, for example, the assignment unit 76 assigns, for example, the first one of four sub divided shots each having the irradiation time tk of 128Δ, which is obtained by dividing the irradiation time tk of 512Δ, to a switch beam (beam "b"). Moreover, the assignment unit 76 assigns the second one of the four sub divided shots each having the irradiation time tk of 128Δ to a switch beam (beam "c"). Further, the assignment unit 76 assigns the third one of the four sub divided shots each having the irradiation time tk of 128Δ to a switch beam (beam "b"). Furthermore, the assignment unit 76 assigns the fourth one of the four sub divided shots each having the irradiation time tk of 128Δ to a switch beam (beam "a"). The assignment unit 76 assigns one of two sub divided shots each having the irradiation time tk of 128Δ, which is obtained by dividing the irradiation time tk of 256Δ, to a switch beam (beam "d"), and the other of the two sub divided shots each having the irradiation time tk of 128Δ to a reference beam (beam "c"). Further, the assignment unit 76 assigns a divided shot having the irradiation time tk of 128Δ to a switch beam (beam "b"). Moreover, the assignment unit 76 assigns, to a reference beam (beam "a"), a divided shot having the irradiation time tk of 64Δ, a divided shot having the irradiation time tk of 32Δ, a divided shot having the irradiation time tk of 16Δ, a divided shot having the irradiation time tk of 8Δ, a divided shot having the irradiation time tk of 4Δ, a divided shot having the irradiation time tk of 2Δ, and a divided shot having the irradiation time tk of Δ.

It should be set in advance which divided shot is assigned to a reference beam and which divided shot is assigned to a switch beam. Here, a plurality of divided shots and a plurality of sub divided shots should be assigned to the actual reference beam and the actual switch beam which are specified for each pixel.

In FIGS. 20A and 20B, the maximum value $t_o$ of the exposure time of a continuous ON beam at a certain pixel is 256Δ, which is approximately 1/N of 1023Δ. In the offset dose calculation step (S84), using the time $t_o$, the offset dose calculation unit 75 calculates an offset dose by the equation (5).

In the sort processing step (S108), the sort processing unit 78 performs processing for sorting execution orders of divided shots to be collected per beam. By sorting by beam unit, the times of beam switching operations can be reduced, and therefore, the writing time can be shortened. In the case of FIG. 22B, the divided shots are taken care of by a switch beam (beam "d"), a switch beam (beam "c"), a switch beam (beam "b"), and a reference beam (beam "a") in order.

By using sub divided shots, as shown in FIG. 22B, the total irradiation time of a reference beam (beam "a") is 255Δ, the total irradiation time of a switch beam (beam "b") is 256Δ, the total irradiation time of a switch beam (beam "c") is 256Δ, and the total irradiation time of a switch beam (beam "d") is 256Δ. Therefore, the totals of irradiation time periods for irradiating the pixel 36 concerned can be more equalized with each other between or among assigned beams.

In the determination step (S124), the determination unit 92 determines whether the transmitted data of the k-th divided shot is the k'-th data or not, where k' is described below. In the example of FIG. 22B, since the switch beam (beam "d") executes the first and second divided shots, the switch beam (beam "c") executes the third and fourth divided shots, the switch beam (beam "b") executes the fifth and sixth divided shots, and the reference beam (beam "a") executes the seventh and subsequent divided shots, it is set that k'=3, 5, or 7. When the data of the k-th divided shot is the k'-th data, it proceeds to the beam switching step (S126). When the data of the k-th divided shot is not the k'-th data, it proceeds to the k-th divided shot step (S128).

In the case where shot is performed in order from the divided shot having a shorter irradiation time, since the reference beam (beam "a") executes the first to eighth divided shots, the switch beam (beam "b") executes the ninth and tenth divided shots, the switch beam (beam "c") executes the eleventh and twelfth divided shots, and the switch beam (beam "d") executes the thirteenth, fourteenth, and subsequent divided shots, it is set that k'=9, 11, or 13.

In the beam switching step (S126), as shown in FIGS. 21A to 21D, the beam shift processing unit 94 switches beams for irradiating each pixel in order of the reference beam and the three switch beams by performing collective deflection of the entire multi-beams 20. In the example of FIG. 22B, since divided shots are performed in order of the switch beam (beam "d"), switch beam (beam "c"), switch beam (beam "b"), and reference beam (beam "a"), when applying a divided shot based on the data of the third divided shot, the beam is switched from the switch beam (beam "d") to the reference beam (beam "c"). When applying a divided shot based on the data of the fifth divided shot, the beam is switched from the switch beam (beam "c") to the reference beam (beam "b"). When applying a divided shot based on the data of the seventh divided shot, the beam is switched from the switch beam (beam "b") to the reference beam (beam "a").

As described above, according to the second embodiment, the rate of degradation of the dose contrast due to a continuous ON beam (defective beam) can be reduced to around m/(N·M) from m/M which is described in the first embodiment.

Embodiments have been explained referring to specific examples described above. However, the present invention is not limited to these specific examples.

While the apparatus configuration, control method, and the like not directly necessary for explaining the present invention are not described, some or all of them can be selectively used on a case-by-case basis when needed. For example, although description of the configuration of the control unit for controlling the writing apparatus 100 is omitted, it should be understood that some or all of the configuration of the control unit can be selected and used appropriately when necessary.

In addition, any other multi charged particle beam writing apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing method comprising:
    calculating an offset dose to irradiate all of a plurality of small regions by multiplying one beam dose equivalent to a maximum irradiation time of multi-beams of each pass in multiple writing by a maximum number of defective beams being always ON to irradiate one of the plurality of small regions, which are obtained by dividing a writing region of a target object by a unit irradiation region size of a beam of the multi-beams;
    calculating an incident dose to irradiate a corresponding small region of the plurality of small regions, in addition to the offset dose, for each small region of the plurality of small regions; and
    performing multiple writing, using multi-beams including a defective beam being always ON, such that a beam of a total dose, between the incident dose having been calculated for the corresponding small region and the offset dose for the each small region, irradiates the corresponding small region for the each small region, while switching a beam to irradiate the each small region for the each pass of the multiple writing, and controlling an irradiation time equivalent to the offset dose by a common blanking mechanism which collectively blanking-controls the multi-beams.

2. The method according to claim 1, wherein the incident dose is obtained by using a value which is calculated by solving a dose equation of a threshold model using a term of a forward scatter dose, a term of a backscatter dose, and a term of the offset dose.

3. The method according to claim 1, wherein
    a shot of the multi-beams of the each pass of the multiple writing is divided into a plurality of divided shots to be continuously superposed to a same position, and
    for the each pass, after performing a part of divided shots of the plurality of divided shots, a beam to irradiate the each small region is switched to another beam by collective deflection of the multi-beams, and other divided shots of the plurality of divided shots are performed.

4. The method according to claim 1, further comprising:
    detecting the defective beam being always ON from the multi-beams.

5. The method according to claim 1, further comprising:
    inputting exposure order information to acquire information on a pass concerned and a small region concerned exposed by the defective beam in a plurality of passes of the multiple writing; and
    determining, for the each small region, an irradiation time of the each pass, based on the information on the pass concerned and the small region concerned exposed by the defective beam in the multiple writing.

6. The method according to claim 5, wherein an irradiation time of each of passes as many as possible in the plurality of passes in the multiple writing is determined to be a time obtained by dividing the maximum irradiation time to irradiate one of the plurality of small regions with a beam by multiplicity of the multiple writing, and remaining time is allotted to one of the plurality of passes of the multiple writing.

7. The method according to claim 5, wherein, in the plurality of passes of the multiple writing, an irradiation time of one pass is set to be the irradiation time equivalent to the offset dose, and each irradiation time of remaining passes of the plurality of passes is set to be a value obtained by dividing an irradiation time equivalent to the incident dose by a number of the remaining passes.

8. The method according to claim 5, wherein, with respect to a small region exposed with the defective beam, an irradiation time of each of passes as many as possible in the plurality of passes in the multiple writing is determined to be a time obtained by dividing the maximum irradiation time to irradiate one of the plurality of small regions with a beam by multiplicity of the multiple writing, and remaining time is allotted to one of the plurality of passes of the multiple writing, and
    with respect to small regions not exposed with the defective beam, an irradiation time of each pass of the multiple writing is determined to be a value obtained by dividing an irradiation time equivalent to the total dose of the corresponding small region by the multiplicity, for each of the small regions not exposed with the defective beam.

9. The method according to claim 5, wherein, with respect to a small region exposed with the defective beam, an irradiation time of one pass of the plurality of passes is set to be the irradiation time equivalent to the offset dose, and each irradiation time of remaining passes of the plurality of passes is set to be a value obtained by dividing an irradiation time equivalent to the incident dose by a number of the remaining passes, and
    with respect to small regions not exposed with the defective beam, an irradiation time of each pass of the multiple writing is determined to be a value obtained by dividing an irradiation time equivalent to the total dose of the corresponding small region by the multiplicity, for each of the small regions not exposed with the defective beam.

10. A multi charged particle beam writing apparatus comprising:
    an offset dose calculation processing circuitry configured to calculate, for each pass of multiple writing, when switching a beam to irradiate each small region of a plurality of small regions obtained by dividing a writing region of a target object by a size of a unit irradiation region for one beam of multi-beams, an offset dose to irradiate all of the plurality of small regions by multiplying a dose equivalent to a maximum in each exposure time of a plurality of pre-set beams used for switching at a pass to irradiate the each small region by a maximum number of defective beams to expose one of the plurality of small regions, by using multi-beams including a defective beam being always ON;

a dose calculation processing circuitry configured to calculate an incident dose to irradiate a corresponding small region, in addition to the offset dose, for each small region of the plurality of small regions; and a writing mechanism, including a stage on which the target object is placed and a common blanking mechanism which collectively blanking-controls the multi-beams, configured to perform multiple writing, using multi-beams including a defective beam being always ON, such that a beam of a total dose, between an incident dose having been calculated for the corresponding small region and the offset dose for the each small region, irradiates the corresponding small region for the each small region, while switching a beam to irradiate the each small region for the each pass of the multiple writing, and controlling an irradiation time equivalent to the offset dose by the common blanking mechanism.

11. The apparatus according to claim 10, wherein a shot of the multi-beams of the each pass of the multiple writing is divided into a plurality of divided shots to be continuously superposed to a same position, and the writing mechanism includes a deflector which collectively deflects the multi-beams, for the each pass, in order to switch a beam to irradiate the each small region to another beam between a part of divided shots of the plurality of divided shots and other divided shots of the plurality of divided shots.

* * * * *